United States Patent
Mizukami et al.

(10) Patent No.: US 8,183,624 B2
(45) Date of Patent: May 22, 2012

(54) SEMICONDUCTOR MEMORY DEVICE

(75) Inventors: Makoto Mizukami, Kawasaki (JP);
Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 889 days.

(21) Appl. No.: 12/061,075

(22) Filed: Apr. 2, 2008

(65) Prior Publication Data
US 2008/0253183 A1 Oct. 16, 2008

(30) Foreign Application Priority Data

Apr. 11, 2007 (JP) ................. 2007-104072

(51) Int. Cl.
*H01L 29/788* (2006.01)
(52) U.S. Cl. ................. 257/326; 257/E29.309
(58) Field of Classification Search .............. 365/72;
257/E23.141, E23.142, E21.575, E21.66,
257/E21.678, E21.677, 316, 315, 758, 326,
257/324, 319, 331, 314, E29.3, E29.309;
438/6, 588, 622
See application file for complete search history.

(56) References Cited

U.S. PATENT DOCUMENTS

| | | | | |
|---|---|---|---|---|
| 5,313,417 A * | 5/1994 | Yanagi | ............ | 438/624 |
| 6,372,640 B1 * | 4/2002 | Chen et al. | .............. | 438/656 |
| 6,569,729 B1 * | 5/2003 | Wu et al. | ............ | 438/219 |
| 2007/0158736 A1 | 7/2007 | Arai et al. | | |
| 2008/0099819 A1 | 5/2008 | Kito et al. | | |
| 2008/0173928 A1 * | 7/2008 | Arai et al. | ......... | 257/316 |
| 2009/0246932 A1 * | 10/2009 | Kamioka et al. | ......... | 438/421 |

FOREIGN PATENT DOCUMENTS

| | | |
|---|---|---|
| JP | 2002-57231 | 2/2002 |
| JP | 2003-218242 | 7/2003 |
| JP | 2005-85938 | 3/2005 |

OTHER PUBLICATIONS

U.S. Appl. No. 11/947,008, filed Nov. 29, 2007, Kiyohito Nishihara, et al.

* cited by examiner

*Primary Examiner* — Douglas King
(74) *Attorney, Agent, or Firm* — Oblon, Spivak, McClelland, Maier & Neustadt, L.L.P.

(57) ABSTRACT

A semiconductor memory device includes a substrate having a step including a first upper surface and a second upper surface higher than the first upper surface, a memory cell array formed on the first upper surface, and a peripheral circuit formed on the second upper surface and configured to supply an electrical signal to the memory cell array. The memory cell array includes a stacked structure having a plurality of first interconnection layers and a plurality of second interconnection layers respectively connected to the first interconnection layers. The first interconnection layers are stacked on the first upper surface, are separated from each other by insulating films, and extend in a first direction. The second interconnection layers extend upward and are separated from each other by insulating films.

16 Claims, 24 Drawing Sheets

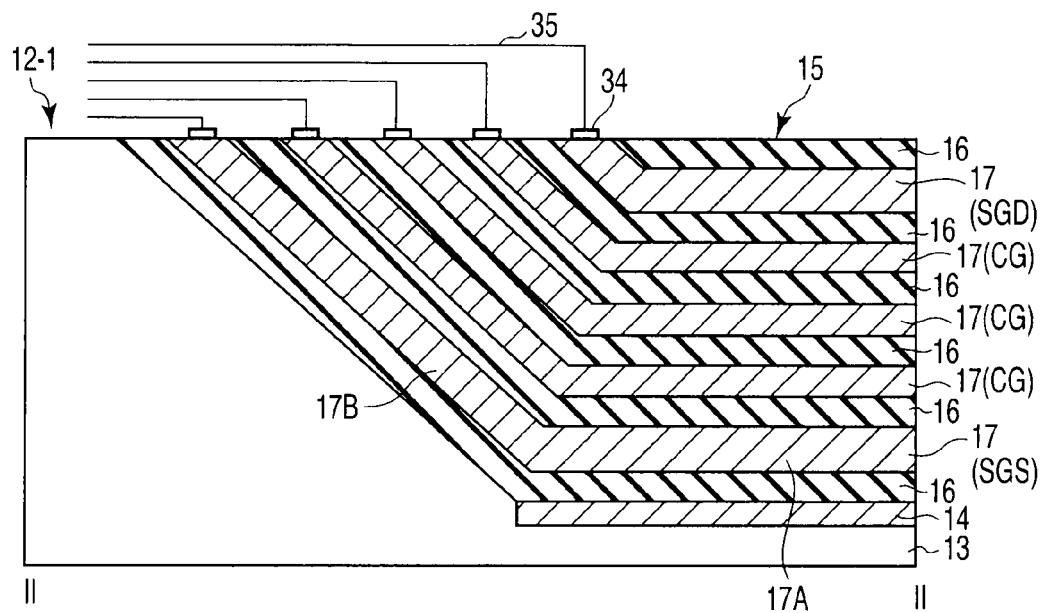
F I G. 22
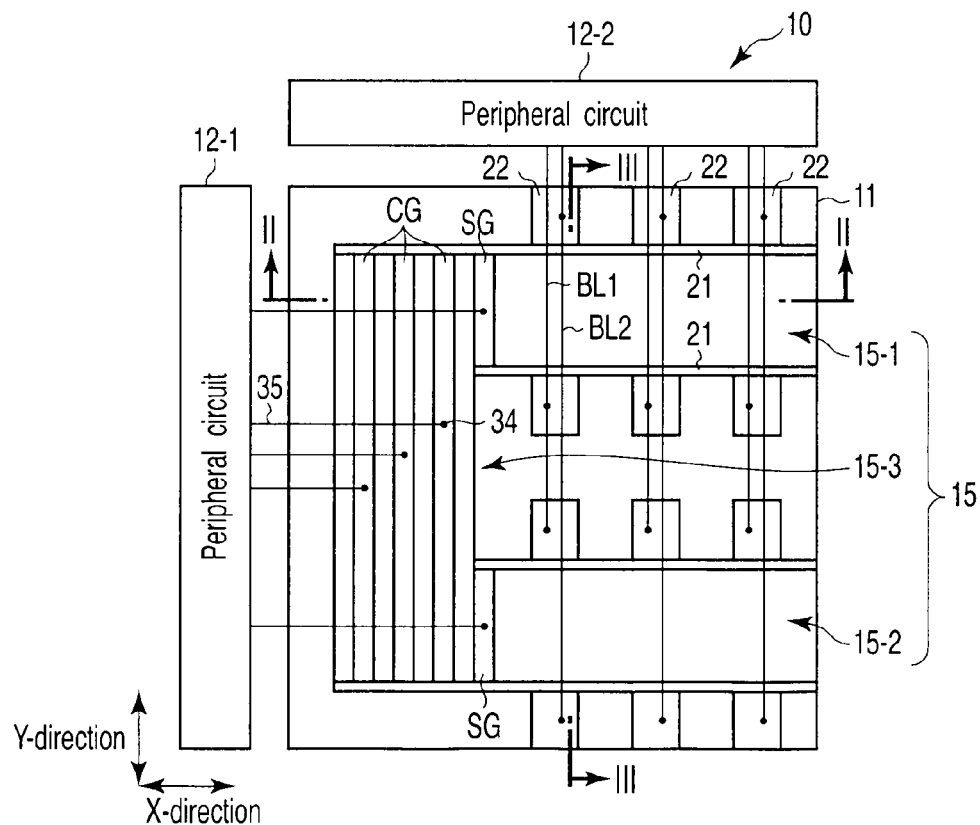
F I G. 23

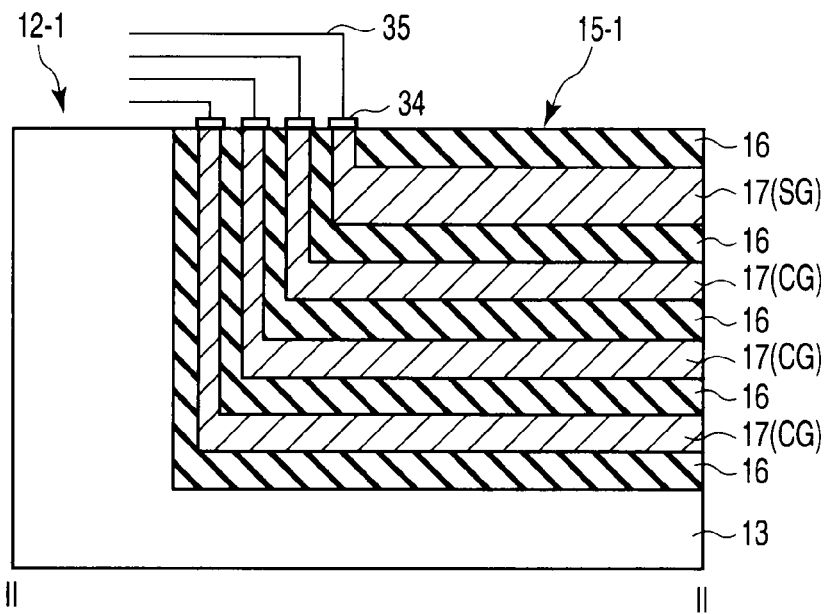
F I G. 2 4
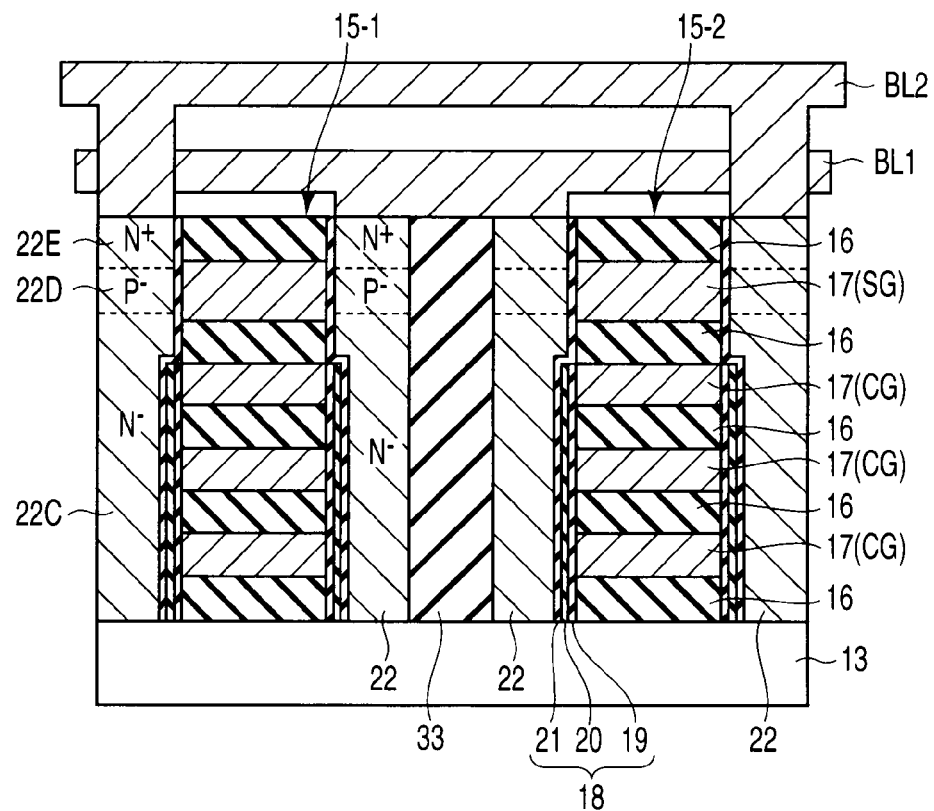
F I G. 2 5

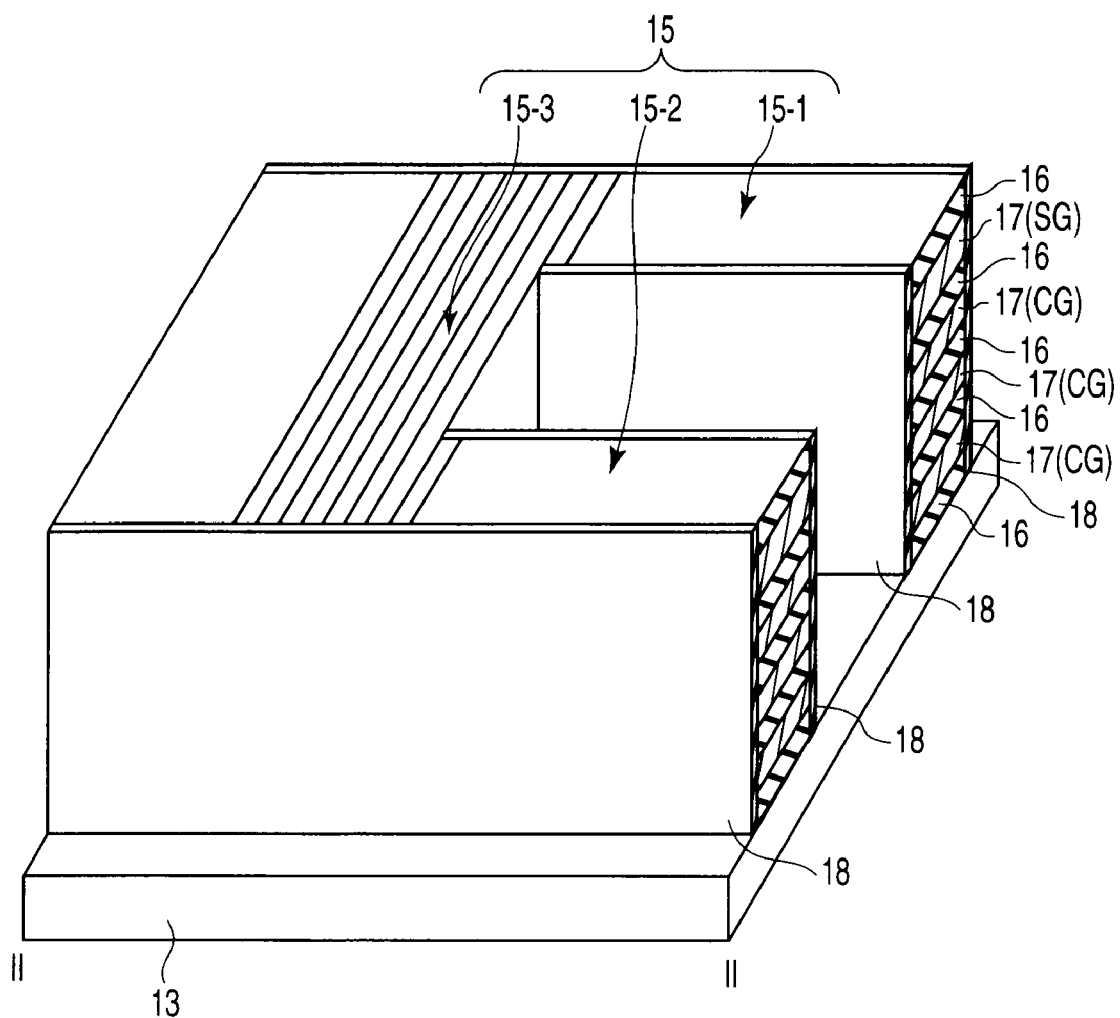
F I G. 2 8

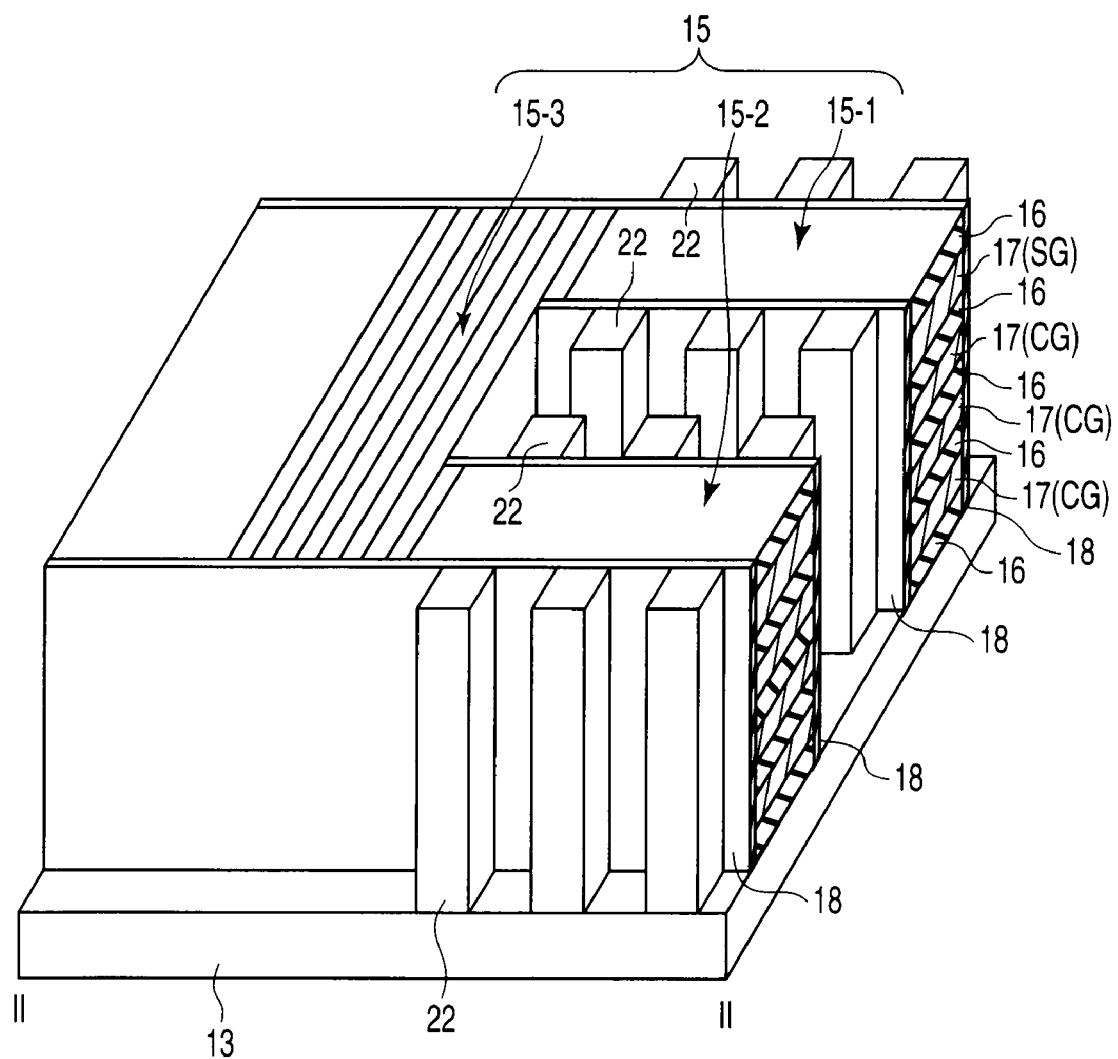
F I G. 29

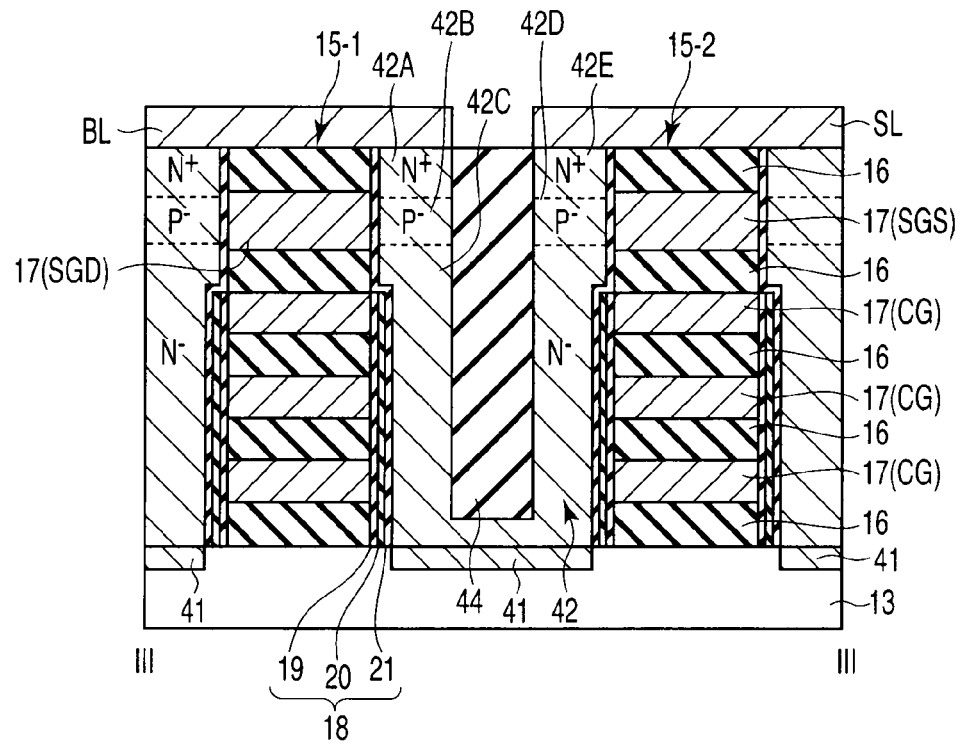
F I G. 31 A
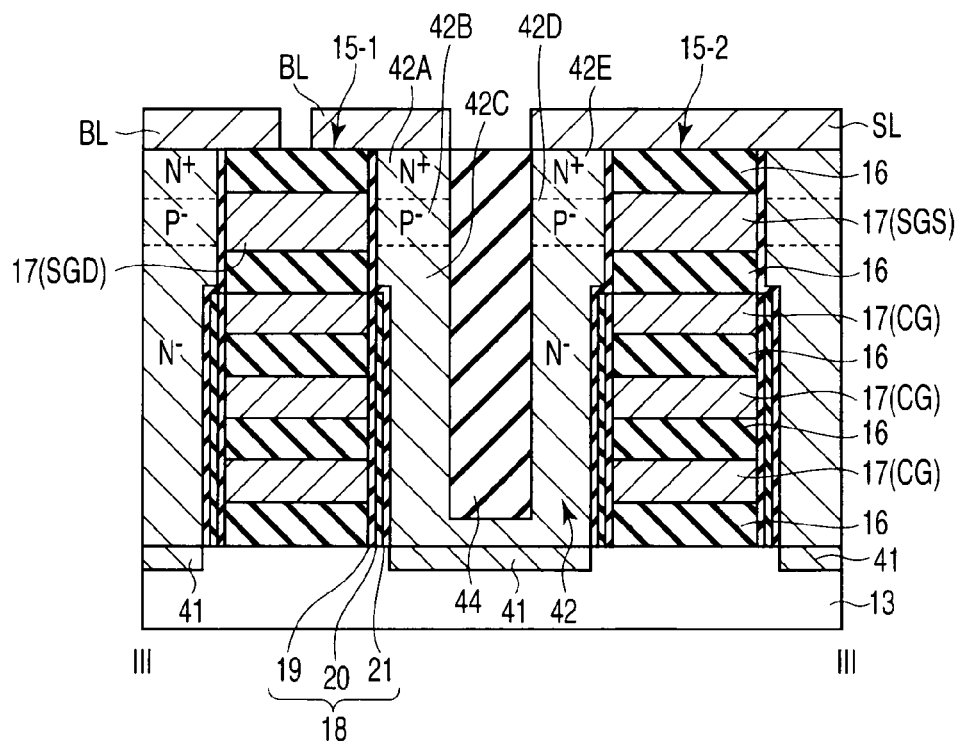
F I G. 31 B

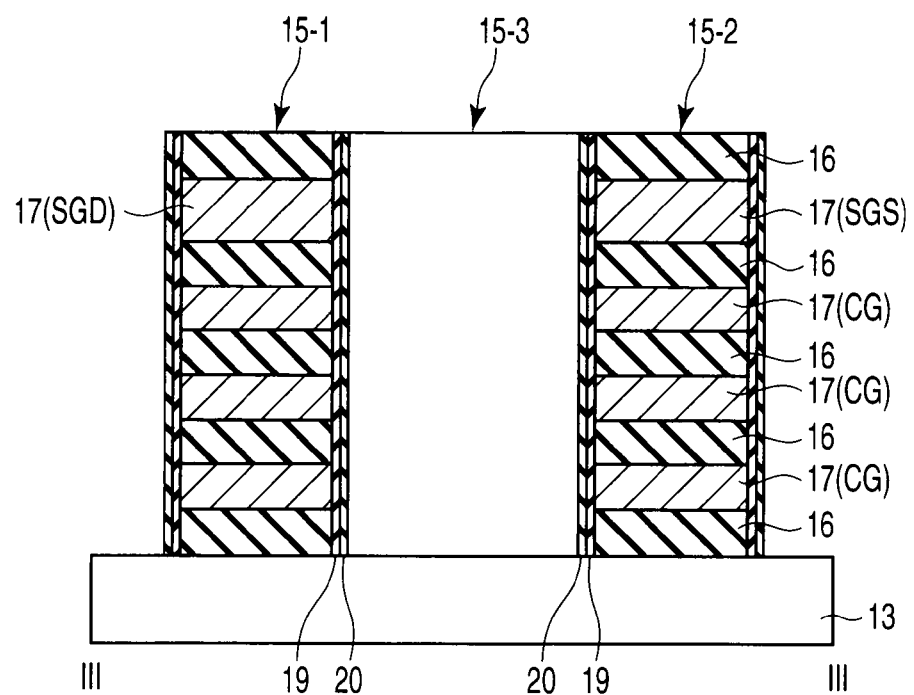
F I G. 3 2
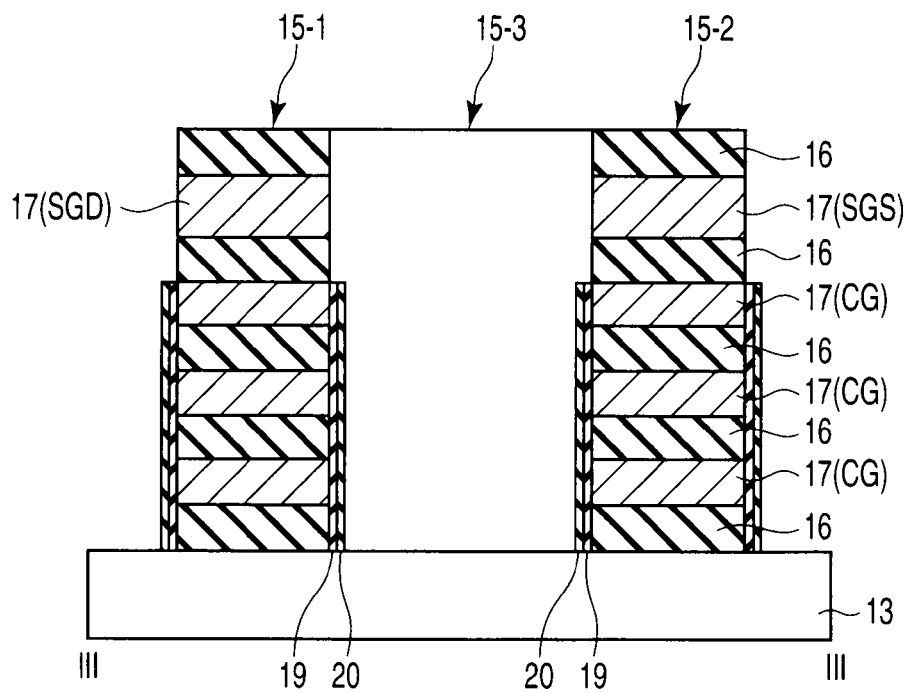
F I G. 3 3

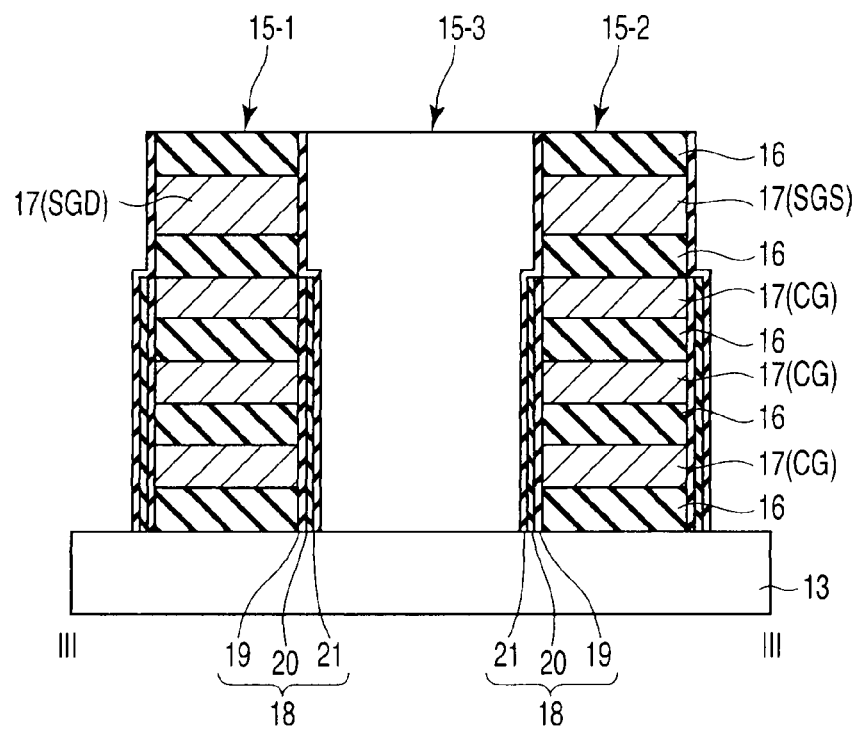
F I G. 3 4
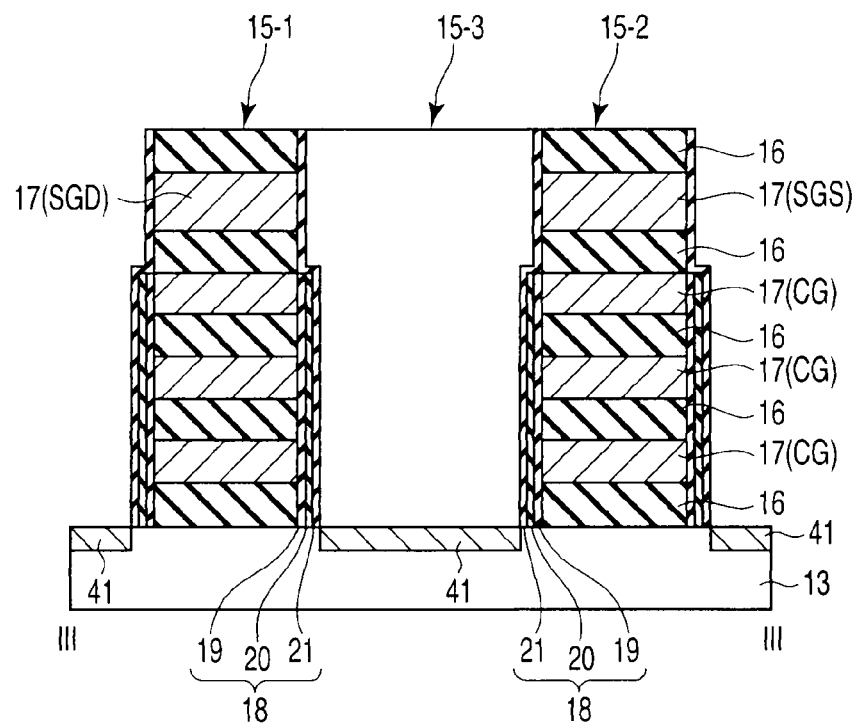
F I G. 3 5

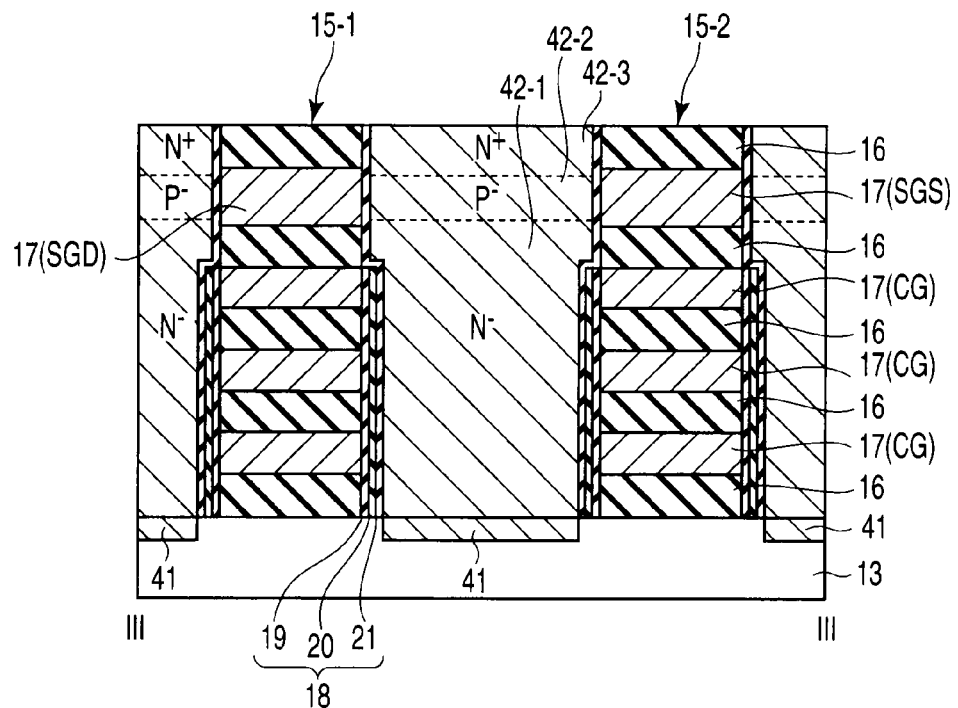
F I G. 36
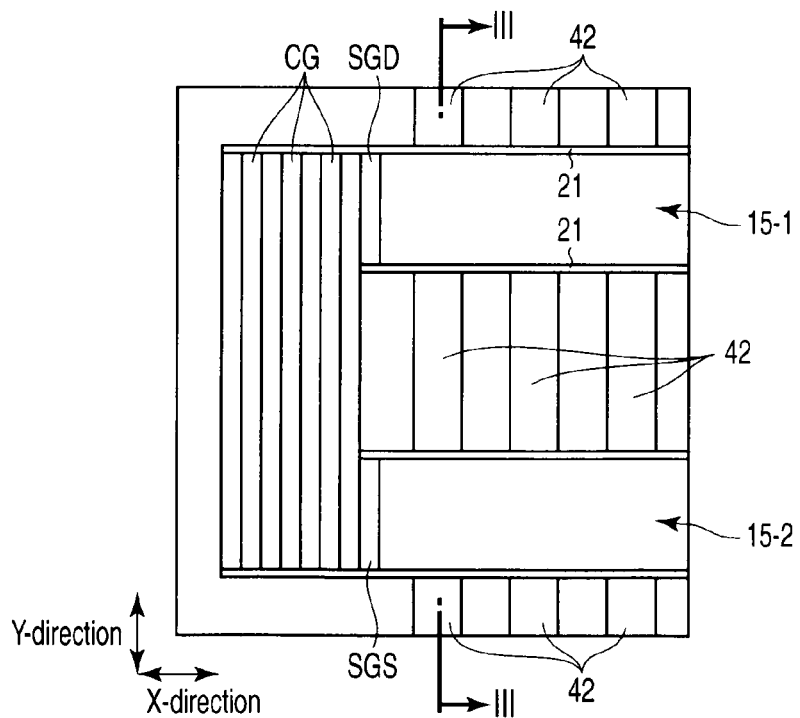
F I G. 37

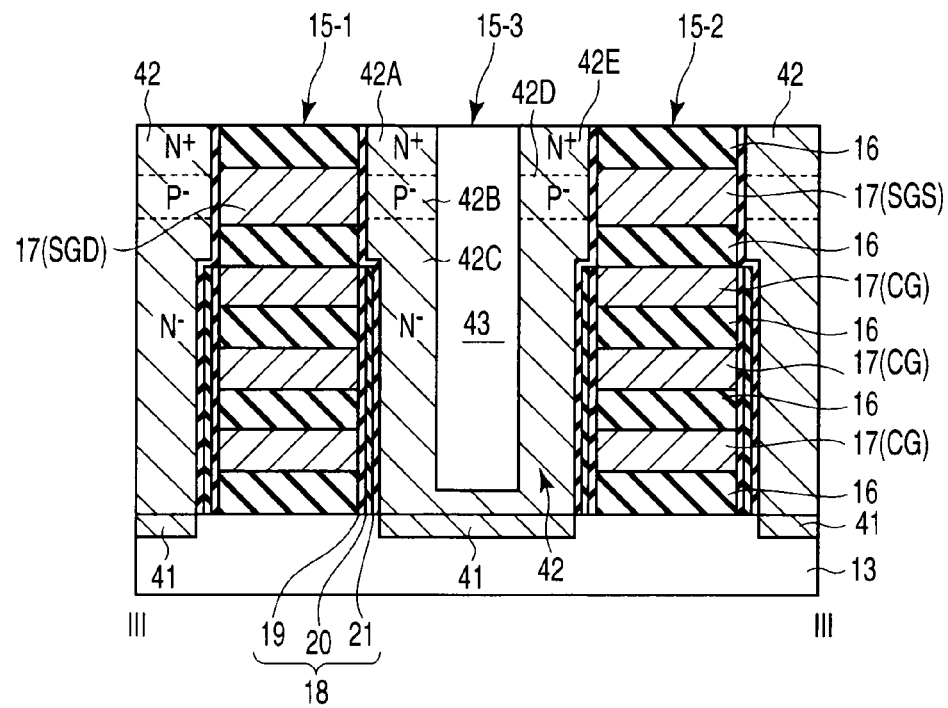
F I G. 38
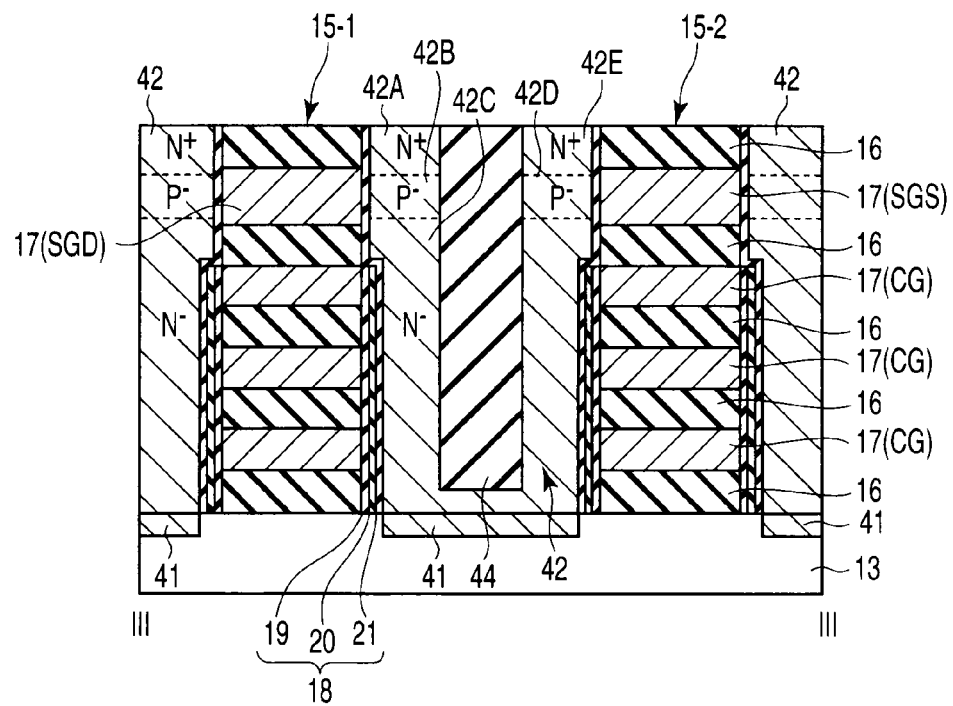
F I G. 39

SEMICONDUCTOR MEMORY DEVICE

CROSS-REFERENCE TO RELATED APPLICATIONS

This application is based upon and claims the benefit of priority from prior Japanese Patent Application No. 2007-104072, filed Apr. 11, 2007, the entire contents of which are incorporated herein by reference.

BACKGROUND OF THE INVENTION

1. Field of the Invention

The present invention relates to a semiconductor memory device and, more particularly, to a semiconductor memory device comprising a plurality of vertically stacked memory cells.

2. Description of the Related Art

As the density of semiconductor elements increases, the semiconductor elements are being more and more downsized. However, the exposure limit and processing limit in the semiconductor element manufacturing process make it difficult to increase the density in the horizontal direction. Therefore, it is being attempted to increase the density by vertically stacking memory cells.

Even when memory cells can be vertically stacked, however, it is difficult to form contacts electrically connecting peripheral circuits to the memory cells. One possible means for solving this problem is a method that forms a via hole in each of vertically stacked memory cells, and forms a contact in this via hole.

Unfortunately, this method decreases the yield and increases the manufacturing cost because an exposing step, developing step, and processing step must be repeated whenever a contact is formed. In addition, if the number of memory cells to be stacked increases, the number of contacts increases, and the depth of via holes also increases. As a consequence, misalignment of contacts shortcircuits interconnections.

As a related technique of this type (Jpn. Pat. Appln. KOKAI Publication No. 2005-85938), a technique that prevents a write error to an unselected memory cell in a nonvolatile semiconductor memory device comprising vertically stacked memory cells is disclosed.

BRIEF SUMMARY OF THE INVENTION

According to a first aspect of the present invention, there is provided a semiconductor memory device comprising:

a substrate having a step including a first upper surface and a second upper surface higher than the first upper surface;

a memory cell array formed on the first upper surface; and a peripheral circuit formed on the second upper surface and configured to supply an electrical signal to the memory cell array, wherein the memory cell array includes a stacked structure having a plurality of first interconnection layers and a plurality of second interconnection layers respectively connected to the first interconnection layers, the first interconnection layers are stacked on the first upper surface, are separated from each other by insulating films, and extend in a first direction, and the second interconnection layers extend upward and are separated from each other by insulating films.

According to a second aspect of the present invention, there is provided a semiconductor memory device comprising:

a substrate having a step including a first upper surface and a second upper surface higher than the first upper surface;

a memory cell array formed on the first upper surface; and a peripheral circuit formed on the second upper surface and configured to supply an electrical signal to the memory cell array, wherein the memory cell array includes:

a first stacked structure having a plurality of first interconnection layers stacked on the first upper surface, separated from each other by insulating films, and extending in a first direction;

a second stacked structure adjacent to the first stacked structure in a second direction perpendicular to the first direction, and having a plurality of second interconnection layers stacked on the first upper surface, separated from each other by insulating films, and extending in the first direction; and a plurality of third interconnection layers connecting the first interconnection layers and the second interconnection layers, respectively, extending upward, and separated from each other by insulating films.

BRIEF DESCRIPTION OF THE SEVERAL VIEWS OF THE DRAWING

FIG. 22 is a sectional view taken along line II-II of a NAND flash memory 10 according to the second embodiment of the present invention;

FIG. 23 is a plan view of a NAND flash memory 10 according to the third embodiment of the present invention;

FIG. 24 is a sectional view of the NAND flash memory 10 taken along line II-II in FIG. 23;

FIG. 25 is a sectional view of the NAND flash memory 10 taken along line III-III in FIG. 23;

FIG. 28 is a perspective view showing a manufacturing step, which follows FIG. 27, of the NAND flash memory 10;

FIG. 29 is a perspective view showing a manufacturing step, which follows FIG. 28, of the NAND flash memory 10;

FIG. 31A is a sectional view of the NAND flash memory 10 taken along line III-III in FIG. 30;

FIG. 31B is a sectional view showing another example of the configuration of the NAND flash memory 10 according to the fourth embodiment;

FIG. 32 is a sectional view taken along line III-III and showing a manufacturing step of the NAND flash memory 10 according to the fourth embodiment;

FIG. 33 is a sectional view taken along line III-III and showing a manufacturing step, which follows FIG. 32, of the NAND flash memory 10;

FIG. 34 is a sectional view taken along line III-III and showing a manufacturing step, which follows FIG. 33, of the NAND flash memory 10;

FIG. 35 is a sectional view taken along line III-III and showing a manufacturing step, which follows FIG. 34, of the NAND flash memory 10;

FIG. 36 is a sectional view taken along line III-III and showing a manufacturing step, which follows FIG. 35, of the NAND flash memory 10;

FIG. 37 is a plan view showing a manufacturing step, which follows FIG. 36, of the NAND flash memory 10;

FIG. 38 is a sectional view taken along line III-III and showing a manufacturing step, which follows FIG. 37, of the NAND flash memory 10;

FIG. 39 is a sectional view taken along line III-III and showing a manufacturing step, which follows FIG. 38, of the NAND flash memory 10;

DETAILED DESCRIPTION OF THE INVENTION

Figure 1:
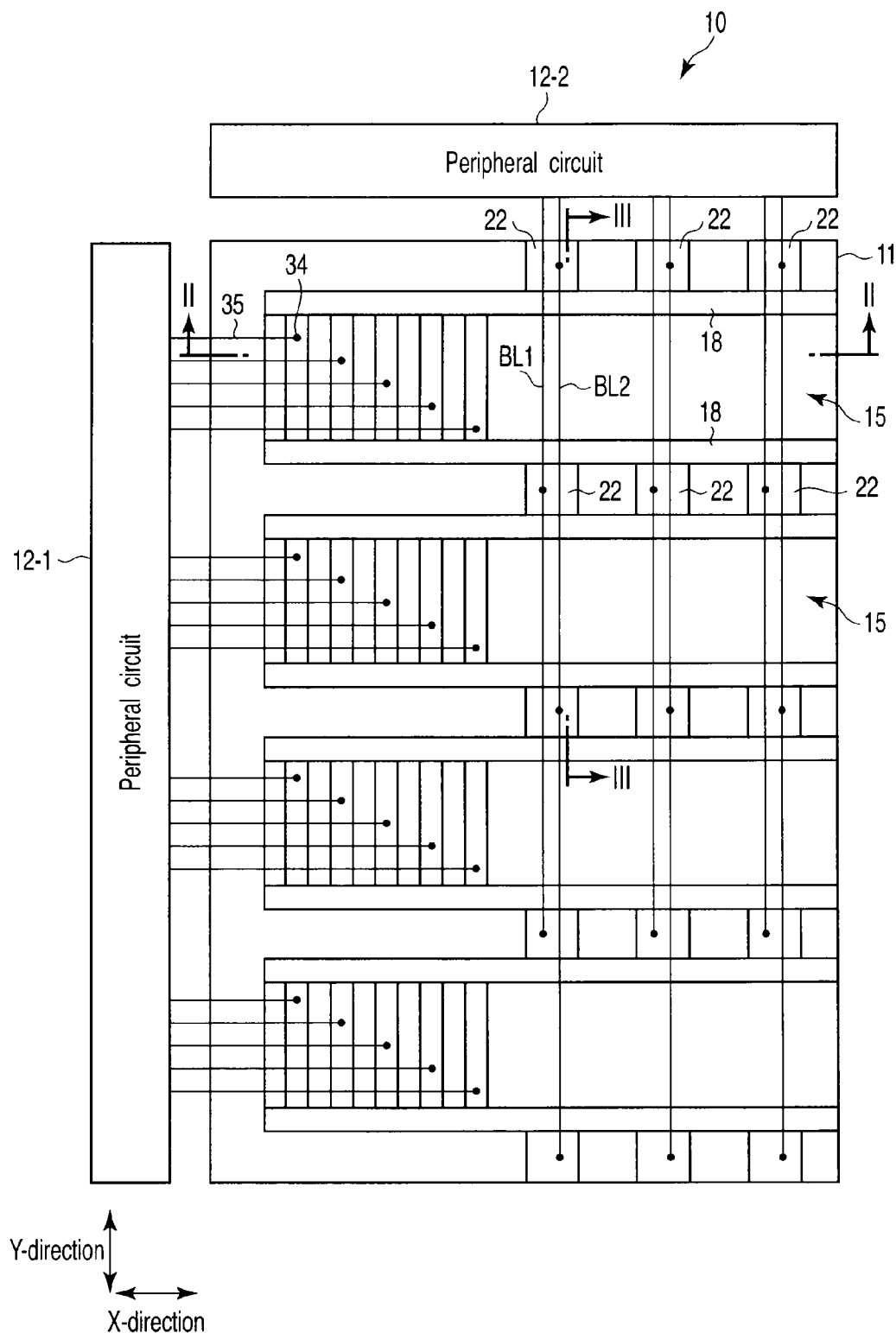
FIG. 1 is a plan view of a NAND flash memory 10 according to the first embodiment of the present invention.

Embodiments of the present invention will be explained below with reference to the accompanying drawing. Note that in the following explanation, the same reference numerals denote elements having the same functions and configurations, and a repetitive explanation will be made only when necessary.

First Embodiment

[1. Basic Arrangement of NAND Flash Memory 10]

Figure 2:
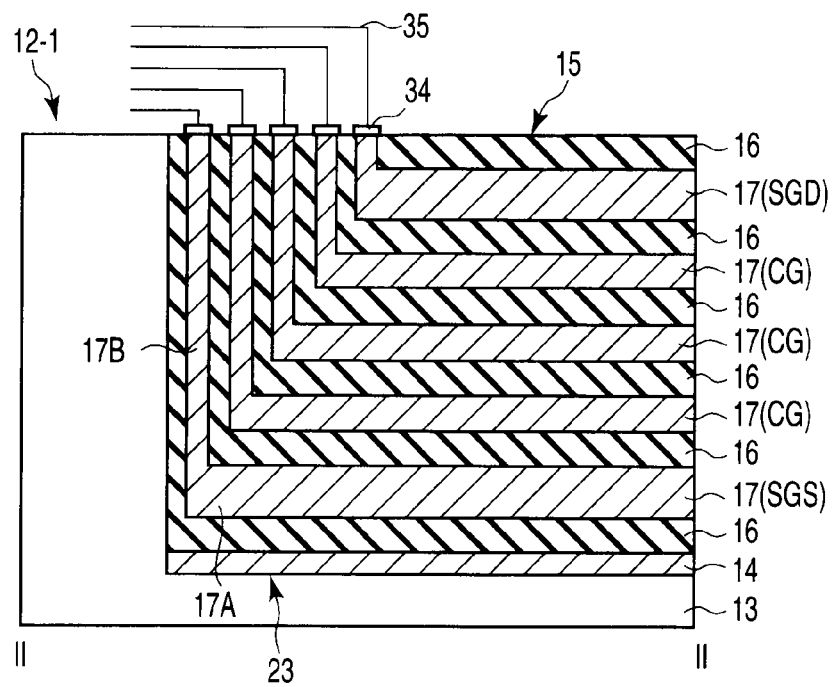
FIG. 2 is a sectional view of the NAND flash memory 10 taken along line II-II in FIG. 1.
Figure 3:
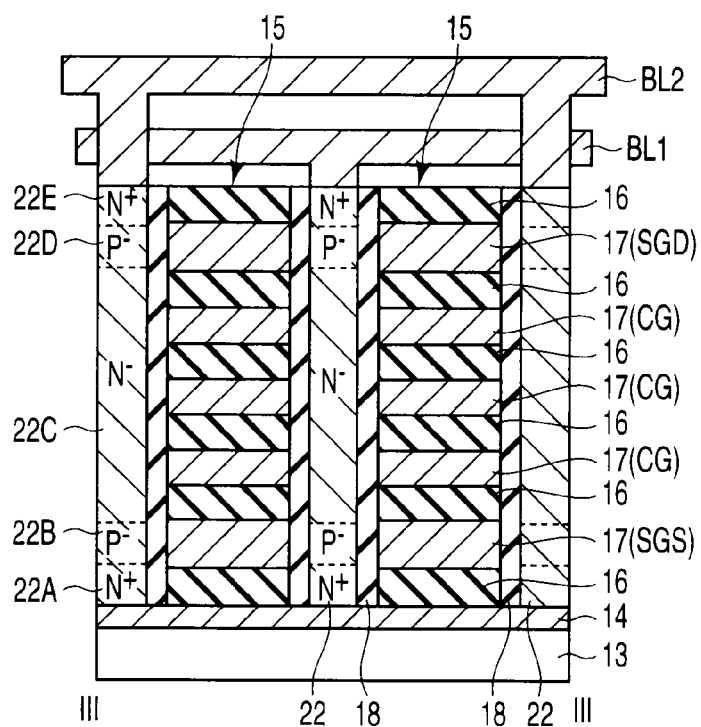
FIG. 3 is a sectional view of the NAND flash memory 10 taken along line III-III in FIG. 1.

First, the basic arrangement of a NAND flash memory 10 will be explained below. FIG. 1 is a plan view of the NAND flash memory 10 according to the first embodiment of the present invention. FIG. 2 is a sectional view of the NAND flash memory 10 taken along line II-II in FIG. 1. FIG. 3 is a sectional view of the NAND flash memory 10 taken along line III-III in FIG. 1.

The NAND flash memory 10 has a memory cell array region and peripheral circuit region. In the memory cell array region, a memory cell array portion 11 including memory cell transistors CT is formed. In the peripheral circuit region around the memory cell array portion 11, peripheral circuits 12-1 and 12-2 for applying a write voltage and the like to the memory cell transistors CT are formed.

An $N^+$-type diffusion region 14 is formed in that surface region of a substrate 13 which corresponds to the memory cell array region. The substrate 13 is made of, e.g., single-crystal silicon (Si). The $N^+$-type diffusion region 14 is formed by heavily doping an $N^+$-type impurity (e.g., phosphorus [P] or arsenic [As]) into the substrate 13. The $N^+$-type diffusion region 14 functions as a common source line of the memory cell array.

On the $N^+$-type diffusion region 14, gate line stacked structures 15 are arranged in the form of long and narrow patterns in the X-direction. Each gate line stacked structure 15 has gate line layers 17 electrically separated from each other by interlayer dielectric layers 16. The interlayer dielectric layers 16 are made of, e.g., silicon oxide. The gate line layers 17 are made of polysilicon, a metal (e.g., tungsten [W], aluminum [Al], or copper [Cu]), or a silicide of any of these metals.

Of the stacked gate line layers 17, the uppermost and lowermost gate line layers respectively function as selection gate lines SGS and SGD as gate lines of selection gate transistors of a NAND cell unit, and the gate line layers arranged between these selection gate lines form control gate lines CG of the memory cell transistors CT. Also, the control gate lines CG correspond to word lines WL. Note that this embodiment discloses an arrangement in which one NAND cell unit has three control gate lines. However, the number of control gate lines need only be 1 or more, so three or more control gate lines may also be formed.

The film thickness (corresponding to the gate length) of the gate line layers 17 serving as the selection gate lines SGS and SGD is set larger than that of the control gate line CG of the memory cell transistor CT sandwiched between them. This is in order to improve the cutoff characteristic of the selection gate transistor.

Gate insulating films 18 each including an insulating charge storage layer are formed on the two side surfaces in the Y-direction of the gate line stacked structure 15. Semiconductor pillars 22 serving as active layers of the memory cell transistors CT are formed on the gate insulating film 18 on one side surface of the gate line stacked structure 15. Similarly, semiconductor pillars 22 are formed on the gate insulating film 18 on the other side surface of the gate line stacked structure 15. Two semiconductor pillars 22 sandwiching the gate line stacked structure 15 oppose each other in the Y-direction. In this embodiment, three semiconductor pillars 22 are formed on each side surface of the gate line stacked structure 15. The three semiconductor pillars 22 are arranged at a predetermined pitch in the X-direction. Each semiconductor pillar 22 has a height equal to that of the gate line stacked structure 15.

The semiconductor pillar 22 comprises an $N^+$-type semiconductor layer 22A, $P^-$-type semiconductor layer 22B, $N^-$-type semiconductor layer 22C, $P^-$-type semiconductor layer 22D, and $N^+$-type semiconductor layer 22E in the order named from below. The $P^-$-type semiconductor layer is formed by lightly doping a $P^-$-type impurity (e.g., boron [B]) into the semiconductor pillar 22. The $N^-$-type semiconductor layer is formed by lightly doping an $N^-$-type impurity into the semiconductor pillar 22. The $N^+$-type semiconductor layer is formed by heavily doping an $N^+$-type impurity into the semiconductor pillar 22.

The $P^-$-type semiconductor layer 22B is formed in that portion of the semiconductor pillar 22 which opposes the selection gate line SGS, and functions as the channel region of a selection gate transistor ST2. The $P^-$-type semiconductor layer 22D is formed in a portion opposing the selection gate line SGD, and functions as the channel region of a selection gate transistor ST1. The $N^+$-type semiconductor layer 22A is formed between the $N^+$-type diffusion region 14 and $P^-$-type semiconductor layer 22B, and functions as the source region of the selection gate transistor ST2. The $N^+$-type semiconductor layer 22E is formed on the $P^-$-type semiconductor layer 22D, and functions as the drain region of the selection gate transistor ST1.

The $P^-$-type semiconductor layers 22B and 22D are formed inside the channel length (in the longitudinal direction of the drawing) of the selection gate transistors ST1 and ST2. This is in order to prevent the selection gate transistors ST1 and ST2 from becoming offset transistors.

The $N^-$-type semiconductor layer 22C is formed in that portion of the memory cell transistor CT, which opposes the control gate line CG, between the $P^-$-type semiconductor layers 22B and 22D. The $N^-$-type semiconductor layer 22C functions as the active layer of the memory cell transistor CT.

In the NAND flash memory 10 shown in FIG. 3, the control gate line CG and the $N^-$-type semiconductor layer 22C opposing the control gate line CG with the gate insulating film 18 sandwiched between them form an electrically rewritable nonvolatile memory cell. That is, the memory cell is a longitudinal cell in which the film thickness of the control gate line CG is the gate length (channel length), and the NAND cell unit is formed by vertically stacking these memory cells.

Figure 4:
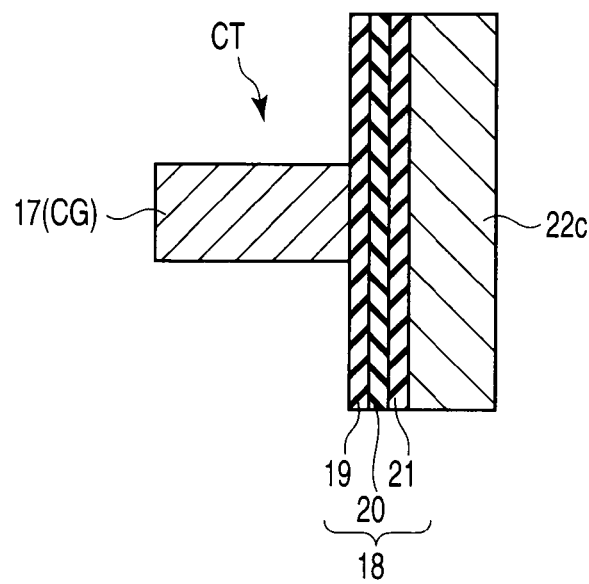
FIG. 4 is a sectional view showing the arrangement of a memory cell transistor CT.

FIG. 4 is a sectional view showing the arrangement of the memory cell transistor CT. The gate insulating film 18 is a stacked insulating film including a charge storage layer 20 that traps and stores electric charge. An interlayer of the stacked insulating film is the charge storage layer 20. The charge storage layer 20 is made of, e.g., silicon nitride.

An insulating film 21 functions as a potential barrier when storing electric charge in the charge storage layer 20 from the $N^-$-type semiconductor layer 22C, or diffusing electric charge stored in the charge storage layer 20 to the $N^-$-type semiconductor layer 22C. The insulating film 21 is made of, e.g., silicon oxide. An insulating film 19 is formed between the charge storage layer 20 and control gate line CG, and prevents the diffusion of the electric charge stored in the charge storage layer 20 to the gate line. The insulating film 19 is made of, e.g., silicon oxide.

As described above, the gate insulating film 18 is made of, e.g., an ONO film (a stacked insulating film including an oxide film, nitride film, and oxide film). However, it is also possible to use an insulating film made of a material other than silicon nitride as the charge storage layer 20, and use an insulating film having a dielectric constant higher than that of silicon oxide as the insulating films 19 and 21.

The memory cell of this embodiment is a metal oxide nitride oxide semiconductor (MONOS) memory cell including the charge storage layer 20 made of a silicon nitride film in the gate insulating film 18. In this memory cell, the whole gate insulating film including the charge storage layer 20 is an insulator. This obviates the need for the process of separating the floating gates of individual cells such as floating gate type memory cells. That is, the gate insulating film 18 need only be formed on the entire side surface of the gate line stacked structure 15, and need not be patterned. This facilitates the implementation of a NAND cell unit in which longitudinal memory cells are vertically stacked.

The MONOS memory cell traps and stores electric charge (electrons) in the charge storage layer 20. The ability to trap electric charge can be represented by the charge trap density; as the charge trap density increases, the amount of electric charge that can be trapped increases.

Electrons are injected into the charge storage layer 20 from the channel region. These electrons injected into the charge storage layer 20 are trapped in traps of the charge storage layer 20. The electrons trapped in the traps cannot easily escape from the traps and become stable. Since the threshold voltage of the memory cell changes in accordance with the charge amount in the charge storage layer 20, data can be stored in the memory cell by discriminating between data "0" and "1" in accordance with the level of the threshold voltage.

The upper portion of the NAND cell unit is covered with an insulating layer (not shown), and a bit line BL running in the Y-direction is formed on this insulating layer. The bit line BL is electrically connected to the upper portion of the semiconductor pillar 22 (more specifically, the $N^+$-type semiconductor layer 22E) via a contact. The bit line BL is also connected to the peripheral circuit 12-2. Note that in this embodiment, the semiconductor pillars 22 are formed on the two side surfaces of the gate line stacked structure 15, and two NAND cell units adjacent to each other in the Y-direction share the gate line stacked structure 15. Accordingly, bit lines BL1 and BL2 are alternately connected to NAND cell units arranged in the Y-direction.

Figure 5A:
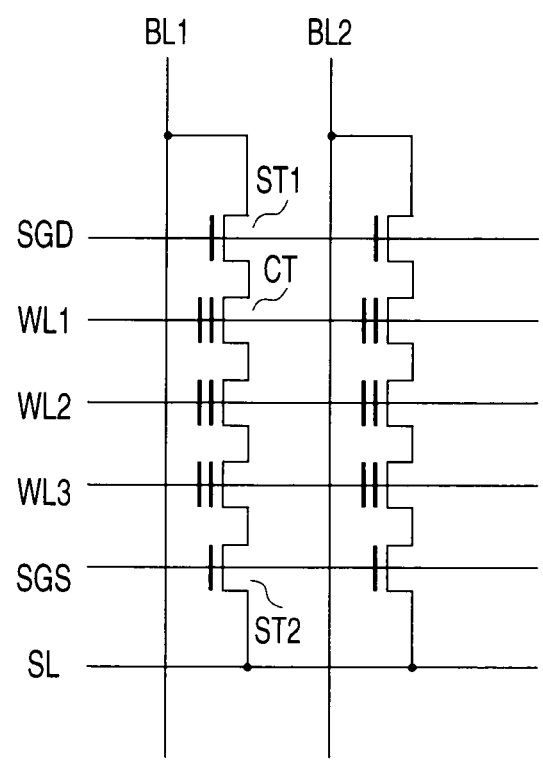
FIG. 5A is a circuit diagram of the NAND flash memory 10 shown in FIG. 3.

FIG. 5A is a circuit diagram of the NAND flash memory 10 shown in FIG. 3. The NAND cell unit 10 comprises a memory cell string including memory cell transistors CT (in this embodiment, three memory cell transistors CT), and the pair of selection gate transistors ST1 and ST2. The selection gate transistor ST1 is connected in series with one end (the drain side) of the memory cell string. The selection gate transistor ST2 is connected in series with the other end (the source side) of the memory cell string.

A control gate line of the memory cell transistor CT functions as the word line WL running in the row direction. A common source line SL running in the row direction is connected to the source terminal of the selection gate transistor ST2. The selection gate lines SGD and SGS are formed to control the turning on/off of the selection gate transistors ST1 and ST2. When writing and reading data, the selection gate transistors ST1 and ST2 function as gates for applying a predetermined potential to the memory cell transistors CT in the NAND cell unit. A memory cell array is formed by arranging these NAND cell units in a matrix.

As shown in FIG. 2, the memory cell array portion 11 is formed in an opening 23 formed by digging (etching) the memory cell array region of the substrate 13. That is, the substrate 13 has a step between the memory cell array region and peripheral circuit region. The peripheral circuits 12-1 and 12-2 are formed on that upper surface of the substrate 13 which corresponds to the peripheral circuit region. In other words, the upper surface of the substrate 13 in the peripheral circuit region in which the peripheral circuits 12-1 and 12-2 are formed corresponds to the bottom surfaces of the peripheral circuits 12-1 and 12-2. Alternatively, a semiconductor layer may also be stacked on only a substrate corresponding to the peripheral circuit region, thereby forming a memory cell array opening surrounded by the semiconductor layer on the substrate. In this case, the peripheral circuits are formed on the semiconductor layer, and the memory cell array portion 11 is formed in the opening.

Accordingly, the bottom surface of the memory cell array portion 11 is set lower than the bottom surfaces of the peripheral circuits 12-1 and 12-2. Also, that upper surface of the substrate 13 which corresponds to the peripheral circuit region is almost leveled with the upper surface of the gate line stacked structure 15.

Each of the gate line layers 17 included in the gate line stacked structure 15 comprises a first line portion 17A running in the horizontal direction, and a second line portion 17B running perpendicularly to the principal surface of the substrate 13 from one end of the first line portion 17A, and extending to the upper surface of the substrate 13. The first and second line portions 17A and 17B are made of the same layer. That is, the lengths in the Y-direction of the first and second line portions 17A and 17B are equal to the width (the length in the Y-direction) of the gate line stacked structure 15.

Contacts 34 equal in number to the gate line layers 17 are formed on the upper surface (corresponding to the upper ends of the second line portions 17B) of the gate line stacked structure 15. The contacts 34 are electrically connected to the peripheral circuit 12-1 via interconnections 35.

Thus, the upper end of the gate line layer 17 is extracted to the upper surface of the substrate 13 by using the same layer structure. Also, the upper surface of the substrate 13 on which the peripheral circuits are formed is almost leveled with the upper surface of the gate line stacked structure 15. This obviates a contact conventionally formed by forming a via hole in a gate line stacked structure and burying a conductor in this via hole. This facilitates the connections between the gate line layers 17 and peripheral circuit 12-1.

Figure 5B:
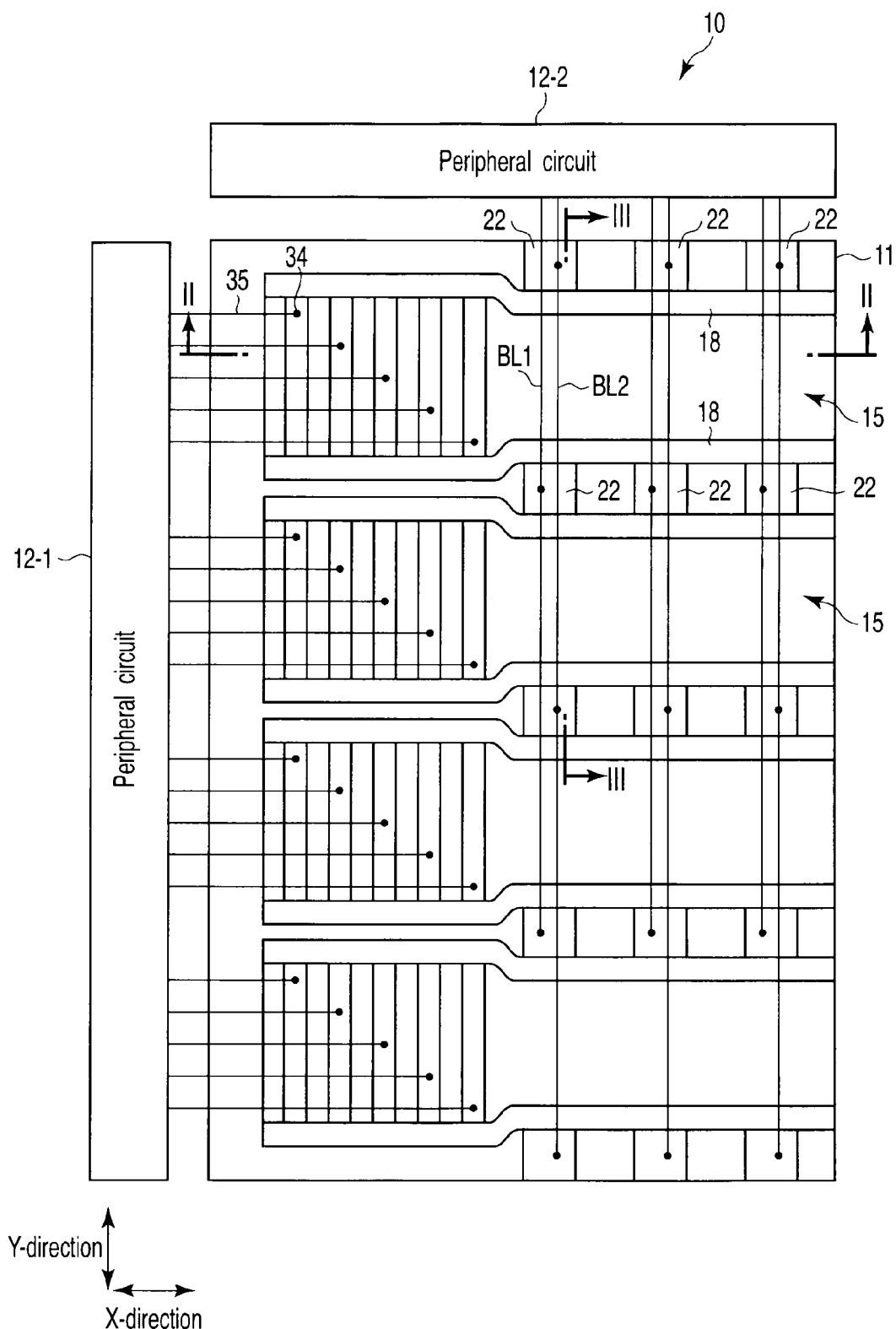
FIG. 5B is a plan view showing another example of the arrangement of the NAND flash memory 10 according to the first embodiment.

Furthermore, as shown in FIG. 5B, the width of the second line portion 17B may also be made larger than that of the first line portion 17A. This structure increases the interval between the contacts 34.

[2. Operation of NAND Flash Memory 10]

The data write operation, data read operation, and data erase operation of the NAND flash memory 10 configured as above will be explained below.

When writing data, a positive write voltage Vpgm is applied to the word line WL of a selected memory cell, and a positive intermediate voltage Vpass (<Vpgm) is applied to the word line WL of an unselected memory cell. The selection gate transistor ST1 is turned on by applying a power supply voltage VCC to the selection gate line SGD on the drain side, and the selection gate transistor ST2 is cut off by applying a ground voltage VSS (0V) to the selection gate line SGS on the source side. 0V or VCC (e.g., 3V) is applied to the selected bit line BL in accordance with the data to be written.

Consequently, the selected gate transistor ST1 and the unselected memory cell in the NAND cell unit are turned on, and the bit line voltage is transmitted to the channel region of the selected memory cell, thereby shifting the threshold voltage of the memory cell.

When writing data "0", for example, 0V is applied to the bit line BL. Since a high electric field is generated between the channel region of the memory cell and the control gate line CG, electrons are injected into the charge storage layer 20, and the threshold voltage shifts in the positive direction.

On the other hand, when writing data "1", the threshold voltage of the memory cell is not changed but maintained (the erased state is maintained), so it is necessary to prevent electrons from being injected into the charge storage layer 20 even when the high positive voltage Vpgm is applied to the control gate line CG of the memory cell. For this purpose, the power supply voltage VCC is applied to the bit line BL. After the power supply voltage VCC is charged in the channel region of the memory cell in the initial stages of write, the write voltage Vpgm is applied to the selected word line WL, and the intermediate voltage Vpass is applied to the unselected word line WL.

Consequently, the capacitive coupling between the control gate line CG and channel region raises the channel potential, but the selection gate transistor ST1 is cut off because the selection gate line SGD on the drain side and the bit line BL are at the power supply voltage VCC. That is, the channel region of the selected memory cell is floated. Accordingly, almost no electrons are injected into the memory cell, so the threshold voltage remains unchanged.

When reading data, a positive voltage that turns on the selection gate transistors ST1 and ST2 is applied to the selection gate lines SGD and SGS, a voltage such as 0V is applied to the selected word line WL, and a read voltage Vread that turns on the selected memory cell is applied to the unselected word line WL. The source line SL is at 0V. For example, the bit line BL is precharged to a predetermined voltage VBL and then floated.

Since the selection gate transistors ST1 and ST2 and unselected memory cell are turned on, the voltage of the bit line BL is determined on the basis of whether the threshold voltage of the selected memory cell is positive or negative. Accordingly, the data can be read by detecting this voltage.

Data erase is performed for every block including a plurality of NAND cell units. When erasing data, the selection gate lines SGD and SGS and bit line BL are floated, 0V is applied to all the word lines WL in a selected block, and a positive erase voltage Vera is applied to the $N^-$-type semiconductor layers 22C. Accordingly, electrons held in the charge storage layers 20 in the selected block are released to the channel regions. As a consequence, the threshold voltage of these memory cells shifts in the negative direction.

On the other hand, all the word lines WL, selection gate lines SGD and SGS, and bit lines BL in an unselected block are floated. In the unselected block, therefore, the capacitive coupling between the word line WL and channel region raises the voltage close to the erase voltage Vera, so no erase operation is performed.

[3. Manufacturing Method of NAND Flash Memory 10]

Figure 6:
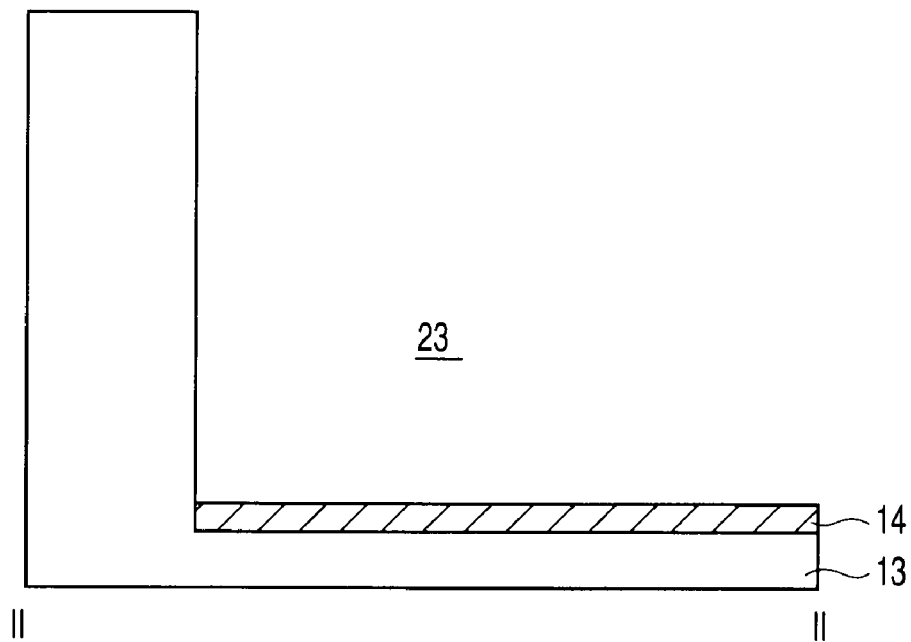
FIG. 6 is a sectional view taken along line II-II and showing a manufacturing step of the NAND flash memory 10 according to the first embodiment.

An example of a manufacturing method of the NAND flash memory 10 will be explained below. As shown in FIG. 6, an opening 23 having a depth equivalent to the height of a gate line stacked structure 15 is formed in a substrate 13 corresponding to a memory cell array region by using lithography and reactive ion etching (RIE). Then, an $N^+$-type diffusion region 14 is formed by doping an $N^+$-type impurity in the substrate 13 corresponding to the memory cell array region.

Figure 7:
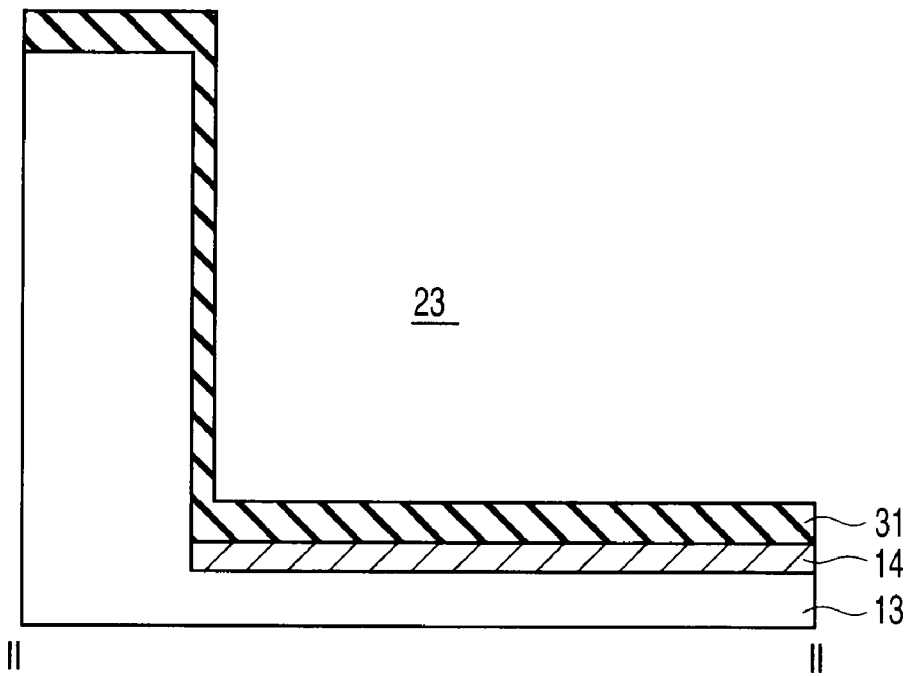
FIG. 7 is a sectional view taken along line II-II and showing a manufacturing step, which follows FIG. 6, of the NAND flash memory 10.

Subsequently, as shown in FIG. 7, a stopper layer 31 is deposited on the entire surface of the substrate 13, thereby forming a staircase stopper layer 31. The stopper layer 31 is made of, e.g., silicon nitride. The stopper layer 31 functions as a stopper when removing a gate line stacked structure deposited in a peripheral circuit region, and also functions as an interlayer dielectric layer 16 that electrically separates the $N^+$-type diffusion region 14 and a gate line layer 17.

Figure 8:
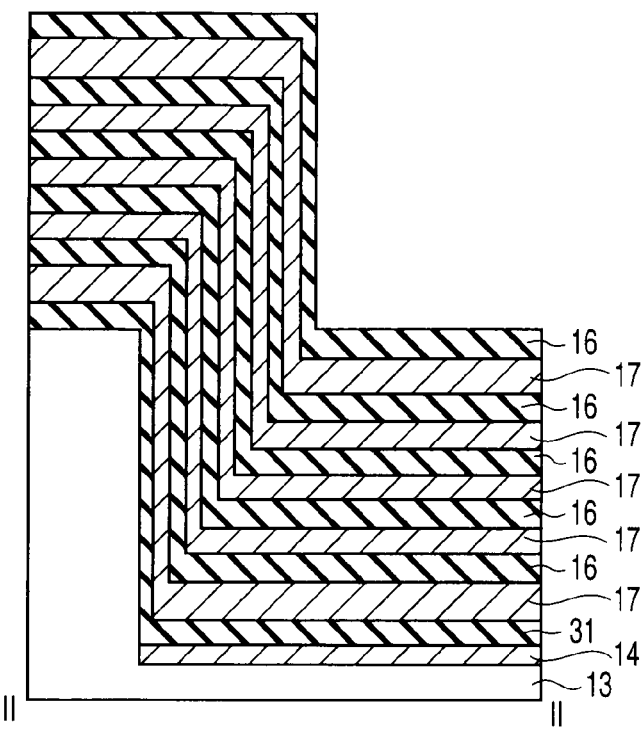
FIG. 8 is a sectional view taken along line II-II and showing a manufacturing step, which follows FIG. 7, of the NAND flash memory 10.

As shown in FIG. 8, gate line layers 17 and interlayer dielectric layers 16 are alternately deposited on the stopper layer 31. This depositing step is similarly repeated to form gate line layers 17 electrically separated from each other by interlayer dielectric layers 16. Thus, a staircase gate line stacked structure is formed.

Figure 9:
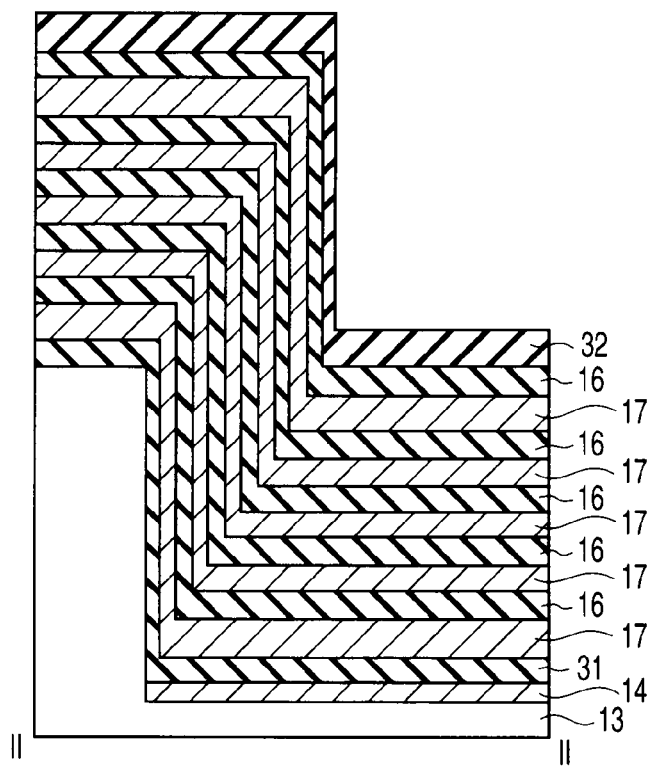
FIG. 9 is a sectional view taken along line II-II and showing a manufacturing step, which follows FIG. 8, of the NAND flash memory 10.
Figure 10:
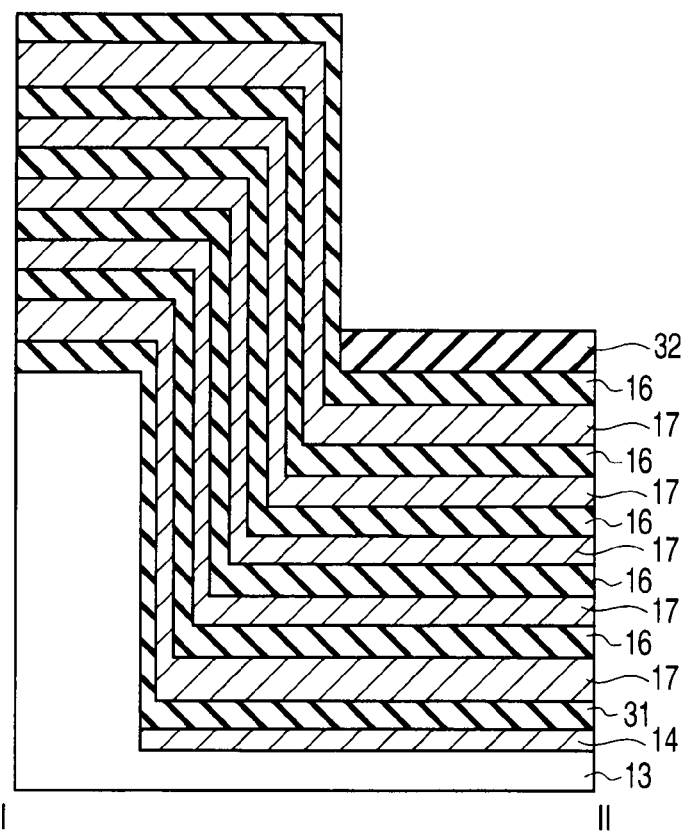
FIG. 10 is a sectional view taken along line II-II and showing a manufacturing step, which follows FIG. 9, of the NAND flash memory 10.

As shown in FIG. 9, a stopper layer 32 is deposited on the uppermost interlayer dielectric layer 16, thereby forming a staircase stopper layer 32. The stopper layer 32 is made of, e.g., silicon nitride. Subsequently, as shown in FIG. 10, the stopper layer 32 is selectively etched by using lithography and RIE, thereby removing the stopper layer 32 from the peripheral circuit region and the side surface of the interlayer dielectric layer 16.

Figure 11:
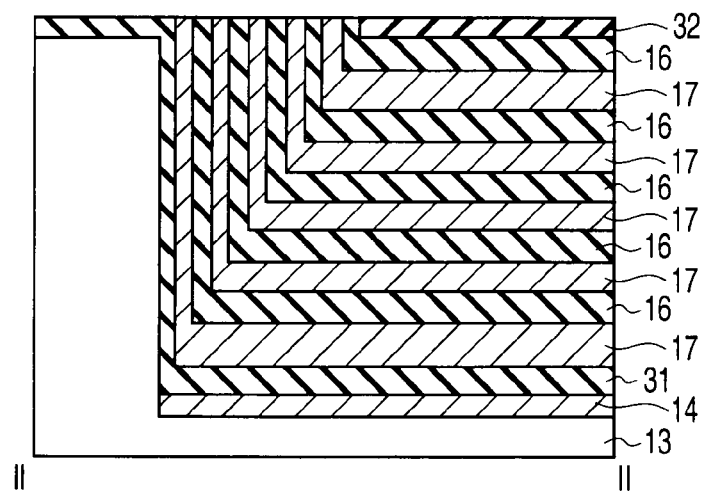
FIG. 11 is a sectional view taken along line II-II and showing a manufacturing step, which follows FIG. 10, of the NAND flash memory 10.

As shown in FIG. 11, the entire device surface is planarized by, e.g., chemical mechanical polishing (CMP) by using the stopper layers 31 and 32 as stoppers. Consequently, the gate line stacked structure higher than the upper surface of the substrate 13 is removed, and the upper surfaces of the peripheral circuit region and memory cell array region are leveled with each other.

Figure 12:
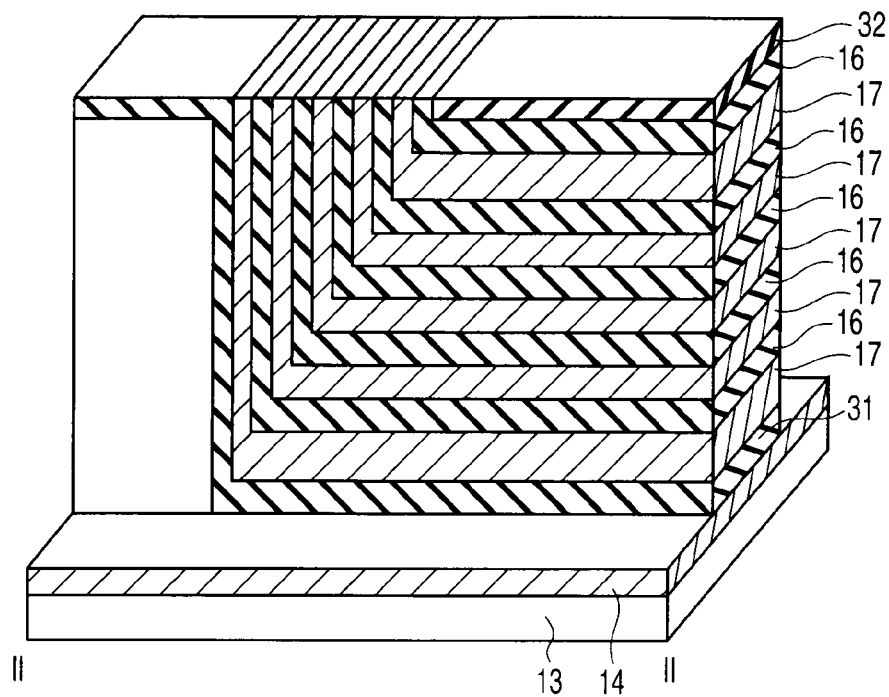
FIG. 12 is a perspective view showing a manufacturing step, which follows FIG. 11, of the NAND flash memory 10.

As shown in FIG. 12, the gate line stacked structure is vertically etched by using lithography and RIE, thereby forming gate line stacked structures 15 arranged in the form of long and narrow patterns in the X-direction on the N$^+$-type diffusion region 14. Note that FIG. 12 shows only one gate line stacked structure 15.

Note that when forming the structure shown in FIG. 5B, an etching mask need only be formed in the lithography step so that the width of the second line portion 17B is larger than that of the first line portion 17A.

Figure 13:
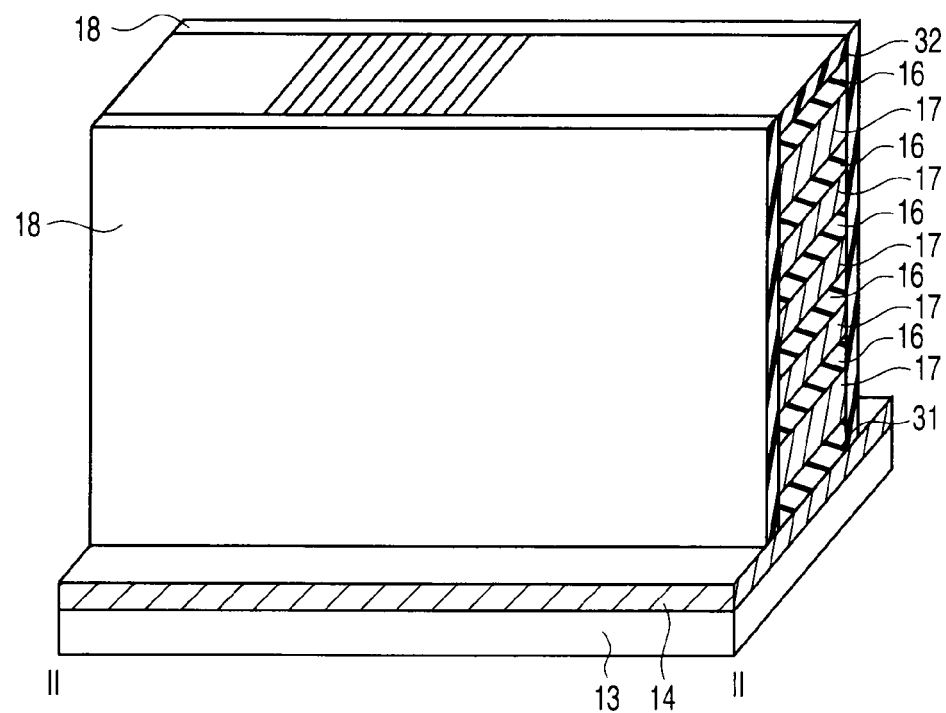
FIG. 13 is a perspective view showing a manufacturing step, which follows FIG. 12, of the NAND flash memory 10.

Subsequently, as shown in FIG. 13, gate insulating films 18 are formed on the two side surfaces in the Y-direction of the gate line stacked structure 15. The gate insulating film 18 is made of an ONO film (a stacked insulating film including an oxide film, nitride film, and oxide film).

Figure 14:
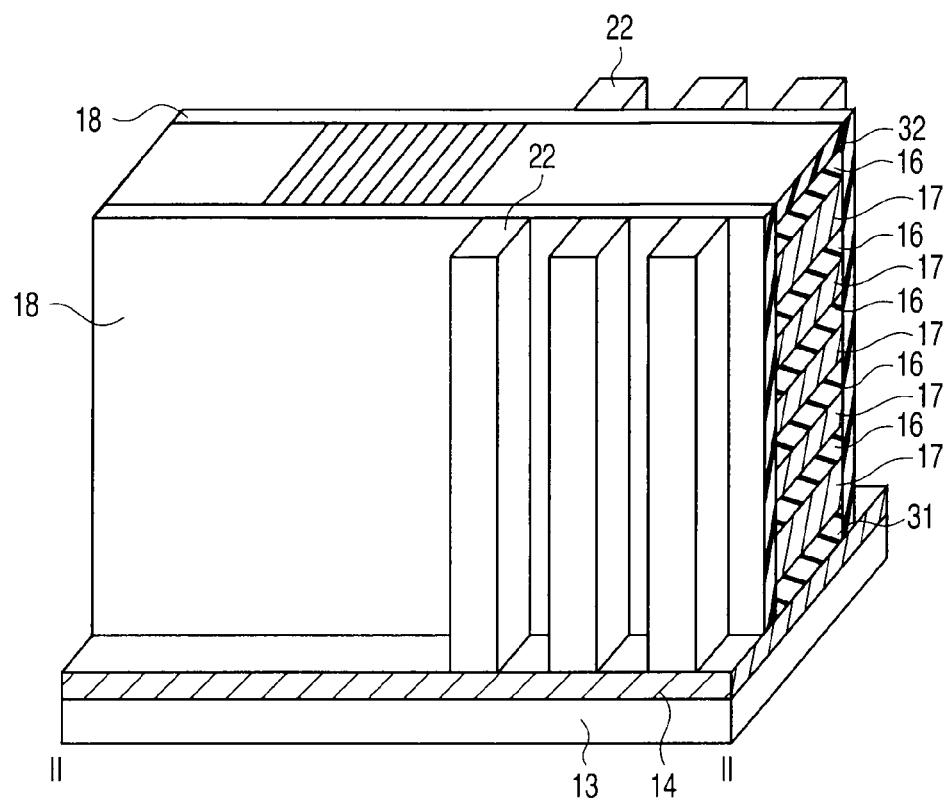
FIG. 14 is a perspective view showing a manufacturing step, which follows FIG. 13, of the NAND flash memory 10.

As shown in FIG. 14, semiconductor layers (an N$^+$-type semiconductor layer 22A, P$^-$-type semiconductor layer 22B, N$^-$-type semiconductor layer 22C, P$^-$-type semiconductor layer 22D, and N$^+$-type semiconductor layer 22E) are formed on the substrate 13 by epitaxial growth so as to fill portions between the gate line stacked structures 15. More specifically, the N$^+$-type semiconductor layer 22A, P$^-$-type semiconductor layer 22B, N$^-$-type semiconductor layer 22C, P$^-$-type semiconductor layer 22D, and N$^+$-type semiconductor layer 22E are formed by repeating deposition of amorphous silicon and doping of an impurity. In this manner, the semiconductor layers having the crystal axis aligned with that of the semiconductor substrate 13 are formed on it.

Then, these semiconductor layers are selectively etched and separated into NAND cell units by lithography and RIE. Consequently, pairs of semiconductor pillars 22 opposing each other in the Y-direction are formed on the gate insulating films 18 on the two side surfaces of the gate line stacked structure 15.

After that, interconnections connected to the gate line layers 17 and semiconductor pillars 22 are formed. In this way, the NAND flash memory 10 shown in FIGS. 1 to 3 is formed. Since the NAND flash memory 10 has a three-dimensional structure obtained by stacking arrays, the density can be made higher than that of a two-dimensional arrangement.

[4. Examples of Layout of Contacts 34]

Examples of the layout of the contacts 34 electrically connecting the gate line layers 17 included in the gate line stacked structure 15 to the peripheral circuit 12-1 will be explained below. The upper ends of the gate line layers 17 are connected to the peripheral circuit 12-1. On the upper surface of the gate line stacked structure 15, therefore, the contacts 34 electrically connecting the interconnections 35 connected to the peripheral circuit 12-1 to the gate line layers 17 are formed.

Figure 15:
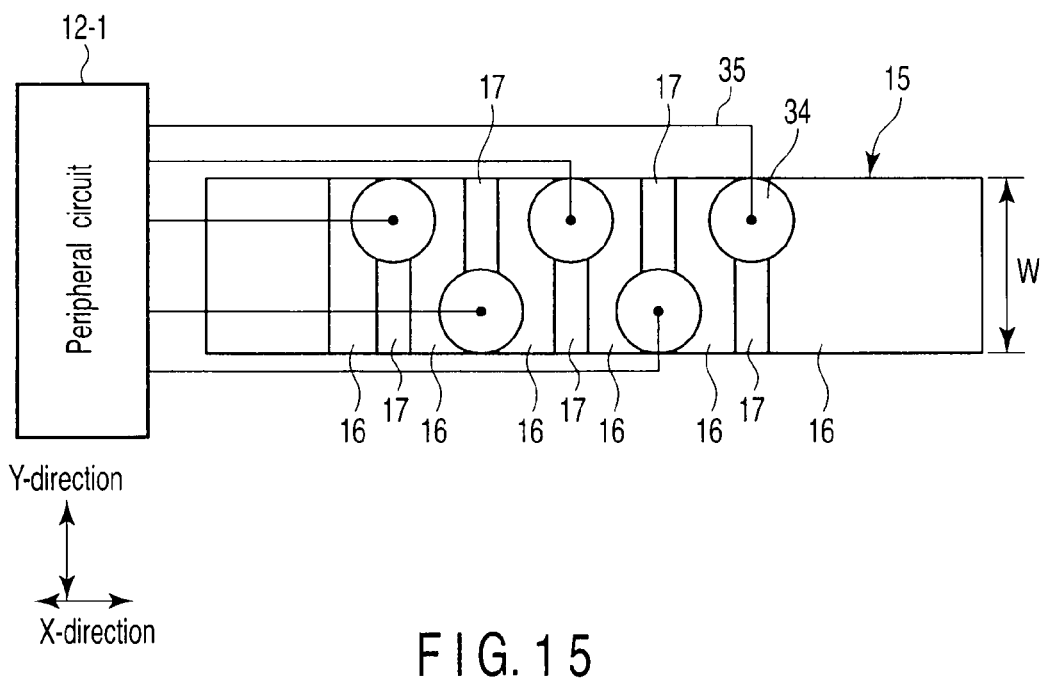
FIG. 15 is a plan view of a gate line stacked structure 15 for explaining an example of the layout of contacts 34.

FIG. 15 is a plan view of the gate line stacked structure 15 for explaining an example of the layout of the contacts 34. Assume that in this embodiment, the width of the gate line layer 17 is 30 nm, the width of the interlayer dielectric layer 16 is 70 nm, and the contact diameter is 100 nm.

As shown in FIG. 15, the contacts 34 connected to the gate line layers 17 are laid out zigzag. Also, the interconnections 35 connected to the contacts 34 are extracted in the Y-direction from the contacts 34, and then extended and connected in the X-direction to the peripheral circuit 12-1. The width W (the length in the Y-direction) of the gate line stacked structure 15 can be decreased by thus laying out the contacts 34 zigzag.

Figure 16:
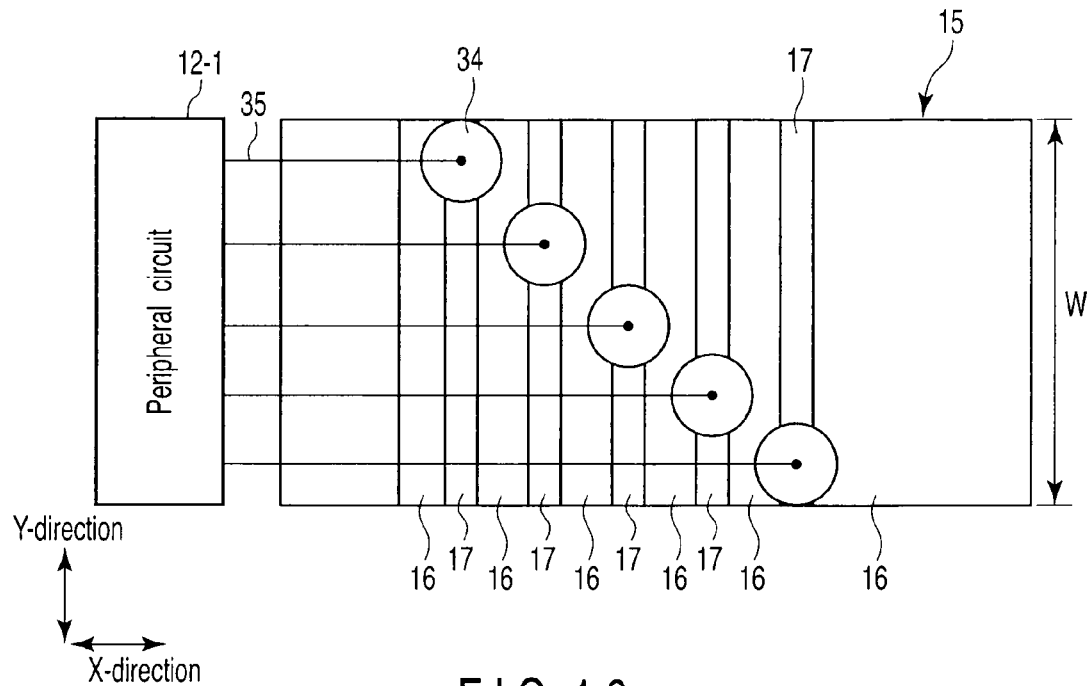
FIG. 16 is a plan view of the gate line stacked structure 15 for explaining another example of the layout of the contacts 34.

FIG. 16 is a plan view of the gate line stacked structure 15 for explaining another example of the layout of the contacts 34. The contacts 34 are laid out so that they approach the peripheral circuit 12-1 in the Y-direction. That is, the contacts 34 are obliquely laid out in the X-direction. The interconnections 35 connected to the contacts 34 are extended in the X-direction from the contacts 34 and connected to the peripheral circuit 12-1. This layout example facilitates the formation of the interconnections 35 because they are straight.

Figure 17:
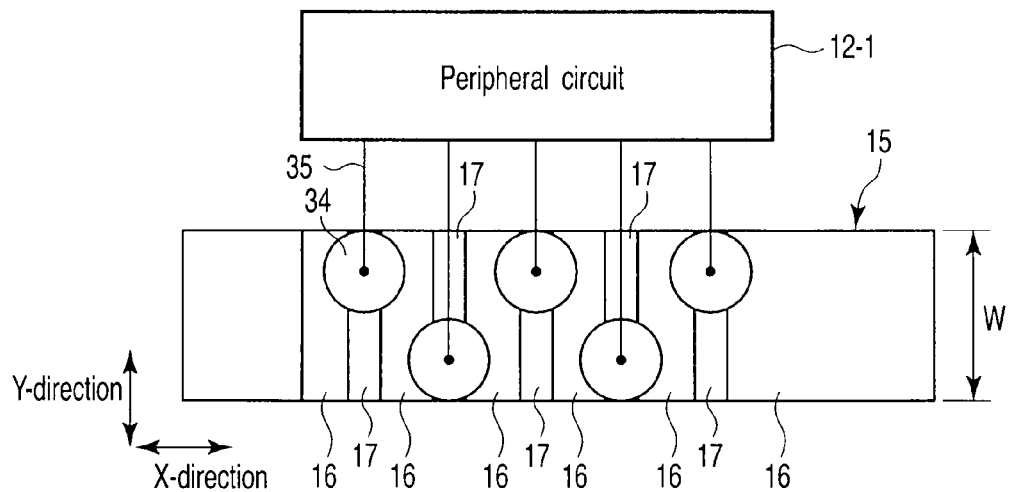
FIG. 17 is a plan view of the gate line stacked structure 15 for explaining still another example of the layout of the contacts 34.

FIG. 17 is a plan view of the gate line stacked structure 15 for explaining still another example of the layout of the interconnections 35. Similar to FIG. 15, the contacts 34 are laid out zigzag. The interconnections 35 connected to the contacts 34 are extended in the Y-direction from the contacts 34 and connected to the peripheral circuit 12-1. Note that in this layout example, the peripheral circuit 12-1 is formed adjacent to the gate line stacked structure 15 in the Y-direction.

This layout example facilitates the formation of the interconnections 35 because they are straight. In addition, since the contacts 34 are laid out zigzag, the width W (the length in the Y-direction) of the gate line stacked structure 15 can be decreased.

To increase the density of memory cells, it is of course advantageous to decrease the thicknesses of the gate line layers 17 and interlayer dielectric layers 16. The structure of this embodiment can suppress a shortcircuit caused by misalignment from the gate line layers 17 when the contacts 34 are laid out, even when the interlayer dielectric layers 16 are thinned. The same effect can also be expected by decreasing the contact diameter.

[5. Other Examples of Arrangement of Semiconductor Pillar 22]

Figure 18:
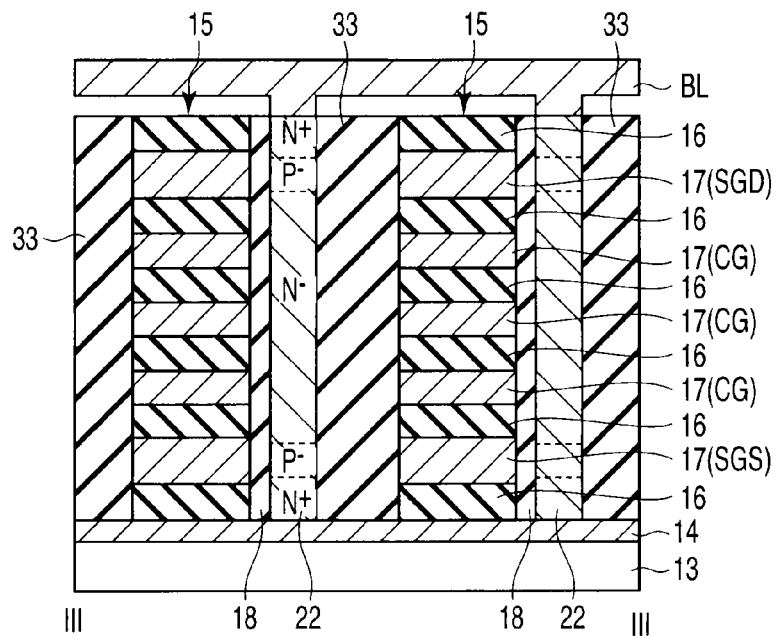
FIG. 18 is a sectional view of the NAND flash memory 10 taken along line III-III, which explains another example of the arrangement of a semiconductor pillar 22.

Other examples of the arrangement of the semiconductor pillar 22 will be explained below. FIG. 18 is a sectional view of the NAND flash memory 10 taken along line III-III, which explains another example of the arrangement of the semiconductor pillar 22.

The NAND flash memory 10 shown in FIG. 18 is an arrangement example in which the relationship between the gate line stacked structures 15 and semiconductor pillars 22 is 1:1. The gate insulating film 18 is formed on one side surface of the gate line stacked structure 15. The semiconductor pillar 22 is formed to oppose one side surface of the gate line stacked structure 15 with the gate insulating film 18 sandwiched between them. A NAND cell unit is thus formed by using the gate line stacked structure 15, gate insulating film 18, and semiconductor pillar 22.

NAND cell units adjacent to each other in the Y-direction are arranged with an insulating layer 33 sandwiched between them. In the arrangement example shown in FIG. 18, NAND cell units adjacent to each other in the Y-direction are connected to the same bit line BL.

Figure 19:
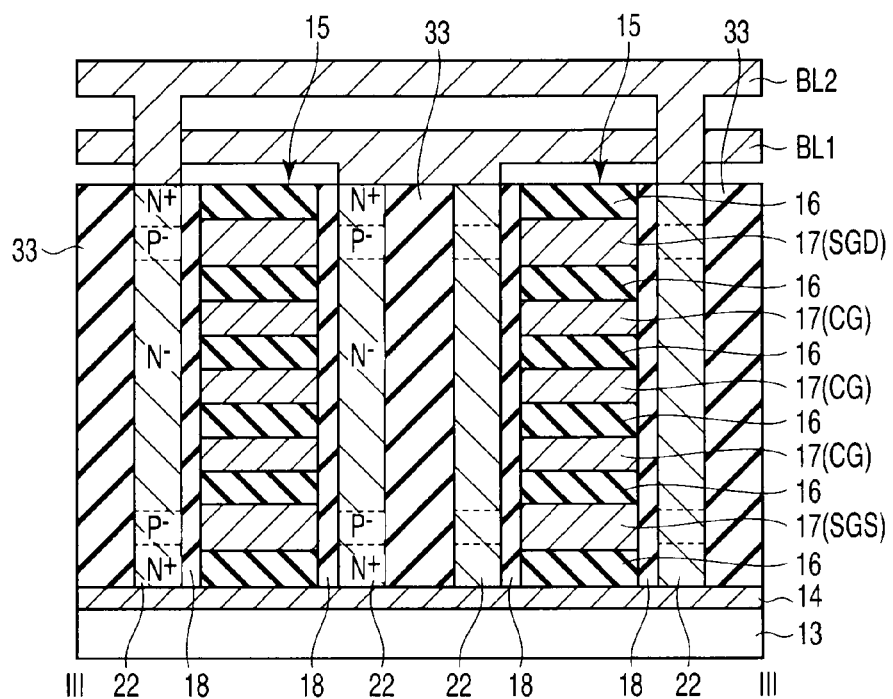
FIG. 19 is a sectional view of the NAND flash memory 10 taken along line III-III, which explains still another example of the arrangement of the semiconductor pillar 22.

The NAND flash memory 10 shown in FIG. 19 is an arrangement example in which the relationship between the semiconductor pillars 22 and gate insulating films 18 is 1:1. The gate insulating films 18 are formed on the two side surfaces in the Y-direction of the gate line stacked structure 15. The semiconductor pillars 22 are formed to oppose the two side surfaces of the gate line stacked structure 15 with the gate insulating films 18 sandwiched between them. Also, the semiconductor pillars 22 adjacent to each other in the Y-direction are arranged with the insulating film 33 sandwiched between them. This arrangement can further increase the integration degree of NAND cell units.

The sections taken along line II-II of the NAND flash memories 10 shown in FIGS. 18 and 19 are the same as FIG. 2. Accordingly, the same effects as those of the basic configuration described previously can be obtained even when using the NAND flash memories 10 shown in FIGS. 18 and 19.

[6. Other Examples of Arrangement of Selection Gate Transistors]

Figure 20:
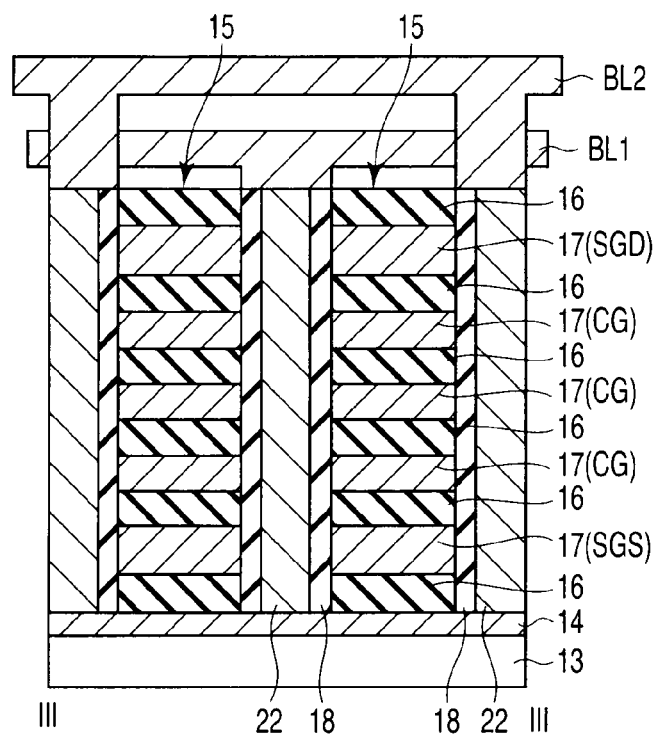
FIG. 20 is a sectional view of the NAND flash memory 10 taken along line III-III, which explains another example of the configuration of selection gate transistors ST1 and ST2.

Other examples of the arrangement of the selection gate transistors ST1 and ST2 will be explained below. FIG. 20 is a sectional view of the NAND flash memory 10 taken along line III-III, which explains another example of the arrangement of the selection gate transistors ST1 and ST2.

The selection gate transistors ST1 and ST2 shown in FIG. 3 use the P$^-$-type semiconductor layers 22B and 22D as the channel regions. That is, the selection gate transistors ST1 and ST2 shown in FIG. 3 are enhancement-type field-effect transistors (FETs). This selection gate transistor is turned off when no bias is applied, and turned on when the interface between the P$^-$-type semiconductor layer and gate insulating film 18 inverts to the N-type upon application of a positive bias.

On the other hand, the selection gate transistors ST1 and ST2 shown in FIG. 20 use N$^-$-type semiconductor layers as the channel regions. That is, the semiconductor pillars 22 shown in FIG. 20 are entirely made of N$^-$-type semiconductor layers. Accordingly, the selection gate transistors ST1 and ST2 shown in FIG. 20 are depletion-type FETs. The selection gate transistors ST1 and ST2 are turned on when no bias is applied, and turned off by pinch-off when the channel regions are depleted upon application of a negative bias.

Even when using the selection gate transistors ST1 and ST2 shown in FIG. 20, therefore, the same operation as that of the NAND flash memory 10 shown in FIG. 3 can be performed by changing the ON and OFF voltages.

Figure 21:
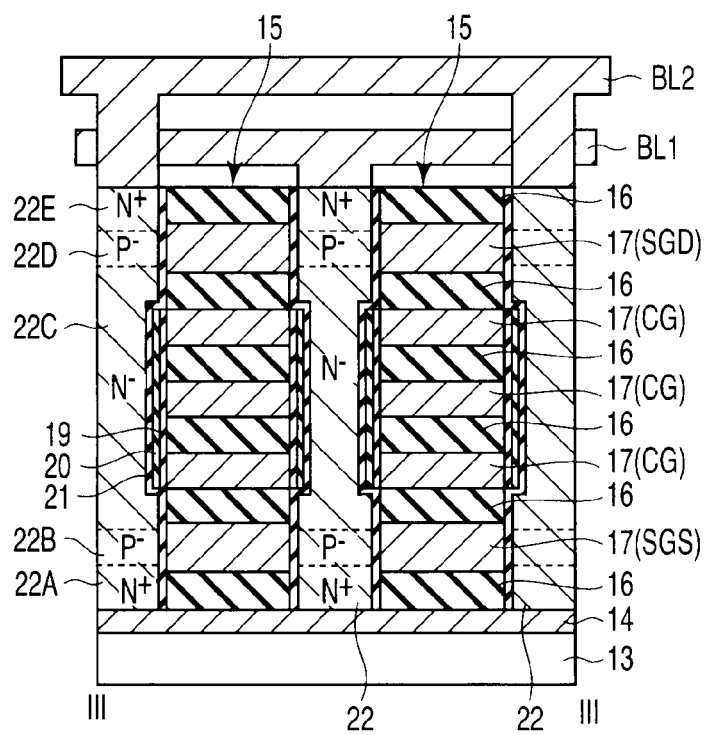
FIG. 21 is a sectional view of the NAND flash memory 10 taken along line III-III, which explains still another example of the configuration of the selection gate transistors ST1 and ST2.

FIG. 21 is a sectional view of the NAND flash memory 10 taken along line III-III, which explains still another example of the arrangement of the selection gate transistors ST1 and ST2.

The gate insulating films 18 made of ONO films are formed on the side surfaces of the control gate lines CG. On the other hand, the single-layered gate insulating films 21 (silicon oxide films) are formed on the side surfaces of the selection gate lines SGD and SGS.

In this arrangement example shown in FIG. 21, the gate insulating films of the selection gate transistors ST1 and ST2 can be thinned. In addition, this gate insulating film does not include the nitride film 20, there is no charge trap to any nitride film, so the threshold fluctuation can be suppressed. This makes it possible to improve the operation characteristics of the selection gate transistors ST1 and ST2.

The sections taken along line II-II of the NAND flash memories 10 shown in FIGS. 20 and 21 are the same as in FIG. 2. Accordingly, the same effects as those of the basic configuration described previously can be obtained even when using the NAND flash memories 10 shown in FIGS. 20 and 21.

In this embodiment as has been described in detail above, the NAND flash memory 10 has the three-dimensional structure obtained by stacking memory cells. This makes the density higher than that of a structure in which memory cells are two-dimensionally arranged.

Also, that upper surface of the substrate 13 which corresponds to the peripheral circuit region can be almost leveled with the upper ends of the gate line layers 17. This obviates the need for contacts for extracting gate lines to the upper surface of a memory cell array. This facilitates the formation of interconnections connecting the peripheral circuit 12-1 and gate line layers 17. That is, all contacts can be formed on the gate line stacked structure 15 at once independently of the number of vertically stacked memory cells. This makes it possible to suppress the decrease in yield and reduce the manufacturing cost.

Furthermore, the contacts for connecting the peripheral circuit 12-1 and gate line layers 17 are formed on the upper surface of the gate line stacked structure 15, and hence can be freely laid out at once. Accordingly, the width of the gate line stacked structure 15 can be decreased by, e.g., laying out the contacts zigzag. This makes it possible to decrease the size in the Y-direction of the NAND flash memory 10.

Second Embodiment

In the second embodiment, that side surface of a gate line stacked structure 15 which opposes a peripheral circuit 12-1 inclines such that the width (the length in the X-direction) of the gate line stacked structure 15 increases upward. This increases the area of the upper surface of a gate line layer 17.

FIG. 22 is a sectional view of a NAND flash memory 10 according to the second embodiment of the present invention. Note that FIG. 22 is a sectional view taken along line II-II in FIG. 1.

That side surface of the gate line stacked structure 15 which opposes the peripheral circuit 12-1 inclines to a direction perpendicular to the principal surface of a substrate 13, so that the length in the X-direction of the gate line stacked structure 15 increases upward. That is, of first and second line portions 17A and 17B forming the gate line layer 17, the first line portion 17A runs horizontally, and the second line portion 17B runs obliquely to come close to the peripheral circuit 12-1 from one end of the first line portion 17A.

The sectional shape of the gate line stacked structure 15 as shown in FIG. 22 can increase the area of the upper surface of the gate line layer 17. Since this increases the contact area of a contact 34 formed on the upper end of the gate line layer 17, the contact formation step is facilitated. More specifically, it is possible to increase the contact diameter, and increase a margin for misalignment in the contact formation step.

Third Embodiment

In the third embodiment, two adjacent gate line stacked structures are connected and share interconnections, thereby reducing the number of interconnections.

FIG. 23 is a plan view of a NAND flash memory 10 according to the third embodiment of the present invention. FIG. 24 is a sectional view of the NAND flash memory 10 taken along line II-II in FIG. 23. FIG. 25 is a sectional view of the NAND flash memory 10 taken along line III-III in FIG. 23.

A gate line stacked structure 15 is formed on a P-type semiconductor substrate 13. The planar shape of the gate line stacked structure 15 is a U-shape. That is, the gate line stacked structure 15 comprises first and second stacked structures 15-1 and 15-2 extending in the X-direction, and a third stacked structure 15-3 extending in the Y-direction and connecting the first and second stacked structures 15-1 and 15-2.

Gate insulating films 18 are formed on the two side surfaces in the Y-direction of the first stacked structure 15-1. Semiconductor pillars 22 serving as active layers of memory cell transistors CT are formed on the gate insulating film 18 on one side surface of the gate line stacked structure 15-1. Semiconductor pillars 22 are also formed on the gate insulting film 18 on the other side surface of the gate line stacked structure 15-1. Two semiconductor pillars 22 sandwiching the gate line stacked structure 15-1 oppose each other in the Y-direction. The semiconductor pillars 22 adjacent to each other in the Y-direction sandwich an insulating layer 33.

Similarly, gate insulating films 18 are formed on the two side surfaces in the Y-direction of the second stacked structure 15-2. Semiconductor pillars 22 are formed on the gate insulating film 18 on one side surface of the gate line stacked structure 15-2. Semiconductor pillars 22 are also formed on the gate insulting film 18 on the other side surface of the gate line stacked structure 15-2. Two semiconductor pillars 22 sandwiching the gate line stacked structure 15-2 oppose each other in the Y-direction. The semiconductor pillars 22 adjacent to each other in the Y-direction sandwich an insulating layer 33.

In the NAND flash memory 10 of this embodiment, only one selection gate transistor ST is formed on the semiconductor pillar 22. That is, one NAND cell unit comprises three memory cell transistors CT and one selection gate transistor ST. When selection gate transistors ST1 and ST2 are formed at the two ends of a memory cell string, the selection gate transistors ST1 and ST2 are simultaneously turned on or off. Accordingly, no problem arises in an operation even when one selection gate transistor ST is formed for a memory cell string.

Note that as shown in FIG. 23, a selection gate line SG included in the first stacked structure 15-1 and a selection gate line SG included in the second stacked structure 15-2 are electrically isolated. That is, the third stacked structure 15-3 includes no selection gate line SG.

Although FIGS. 23 to 25 illustrate an example in which a single-layered gate insulating film 21 is formed below the selection gate line SG, this gate insulating film formed below the selection gate line SG may also be the gate insulating film 18 made of a stacked film (ONO film).

Figure 26:
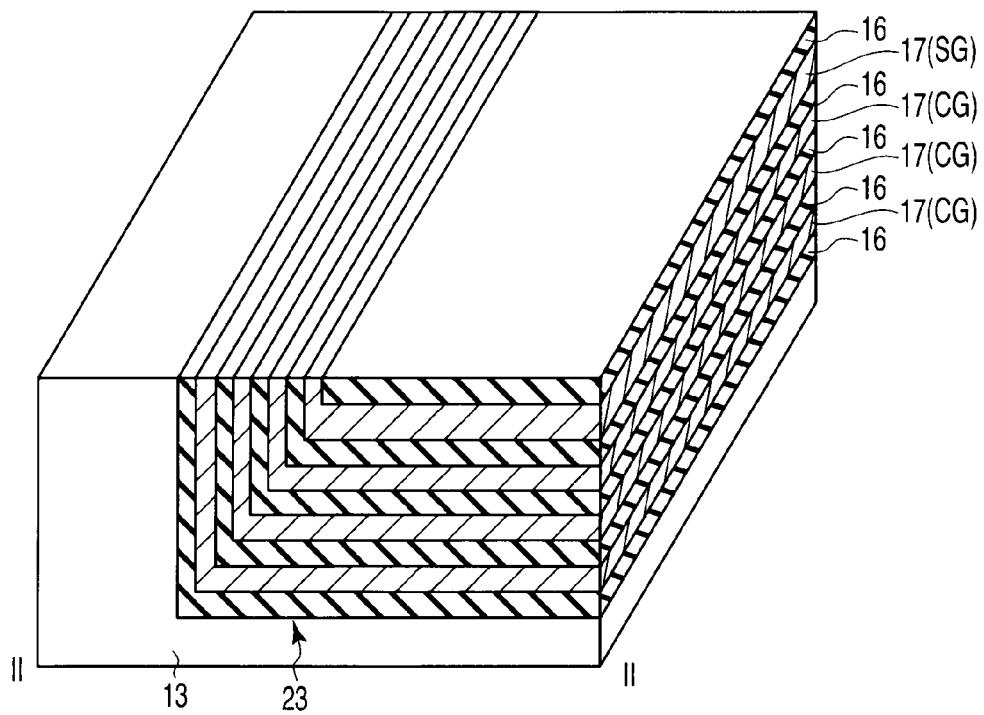
FIG. 26 is a perspective view showing a manufacturing step of the NAND flash memory 10 according to the third embodiment.

An example of a manufacturing method of the NAND flash memory 10 will be explained below. As shown in FIG. 26, an opening 23 having a depth equivalent to the height of a gate line stacked structure 15 is formed in a substrate 13 corresponding to a memory cell array region by using lithography and RIE.

Then, interlayer dielectric layers 16 and gate line layers 17 are alternately stacked. In this case, as in the first embodiment, stopper layers (not shown) to be used in a later planarization step are deposited as the lowermost and uppermost layers. Subsequently, the gate line stacked structure higher than the upper surface of the substrate 13 of a peripheral circuit region is removed by CMP or the like. Consequently, the upper surfaces of the peripheral circuit region and the memory cell array region are leveled with each other.

Figure 27:
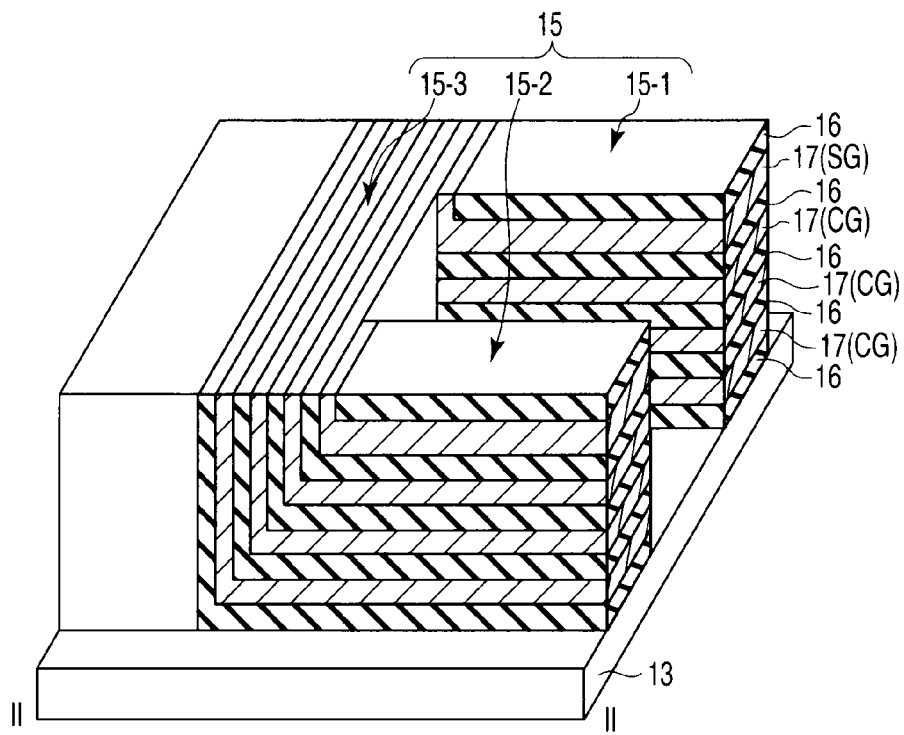
FIG. 27 is a perspective view showing a manufacturing step, which follows FIG. 26, of the NAND flash memory 10.

As shown in FIG. 27, a U-shaped gate line stacked structure 15 is formed by vertically etching the gate line stacked structure by using lithography and RIE. Note that this etching process is performed to separate the gate line layer 17 (SG) into two portions so that first and second stacked structures 15-1 and 15-2 include electrically isolated selection gate lines SG. That is, this etching process exposes the interlayer dielectric layer 16 below the gate line layer 17 (SG) to the side surface of a stacked structure 15-3.

As shown in FIG. 28, gate insulating films 18 are formed on the two side surfaces in the Y-direction of the first stacked structure 15-1. Likewise, gate insulating films 18 are formed on the two side surfaces in the Y-direction of the second stacked structure 15-2. In this case, an ONO film can be formed as the gate insulating film 18 on the entire side surface. It is also possible to form the gate insulating film 18 made of an ONO film on the side surface of a control gate line CG, and a single-layered gate insulating film 21 on the side surface of a selection gate line SG.

As shown in FIG. 29, semiconductor layers (an N$^-$-type semiconductor layer 22C, P$^-$-type semiconductor layer 22D, and N$^+$-type semiconductor layer 22E) are formed on the P-type semiconductor substrate 13 by epitaxial growth so as to fill portions between the stacked structures. More specifically, the N$^-$-type semiconductor layer 22C, P$^-$-type semiconductor layer 22D, and N$^+$-type semiconductor layer 22E are formed by repeating deposition of amorphous silicon and doping of an impurity. In this manner, the semiconductor layers having the crystal axis aligned with that of the substrate 13 are formed on it.

Then, the semiconductor layers are selectively etched and separated into NAND cell units by lithography and RIE. Consequently, semiconductor pillars 22 are formed on the gate insulating films 18 on the two side surfaces of the first stacked structure 15-1. Semiconductor pillars 22 are also formed on the gate insulating films 18 on the two side surfaces of the second stacked structure 15-2.

Subsequently, insulating layers 33 (not shown) are formed by burying an insulator between the semiconductor pillars 22. After that, interconnections connected to the gate line layers 17 and semiconductor pillars 22 are formed. In this way, the NAND flash memory 10 shown in FIGS. 23 to 25 is formed.

In this embodiment as has been described in detail above, the two adjacent gate line stacked structures 15-1 and 15-2 can share the interconnections connected to the gate line layers 17. This makes it possible to reduce the numbers of contacts and interconnections used to connect the gate line stacked structures to a peripheral circuit.

Fourth Embodiment

The fourth embodiment is a modification of the third embodiment, i.e., an example of the configuration of a NAND cell unit in which selection gate transistors ST1 and ST2 are connected to the two ends of a memory cell string by forming a semiconductor layer as an active layer into a U-shape.

Figure 30:
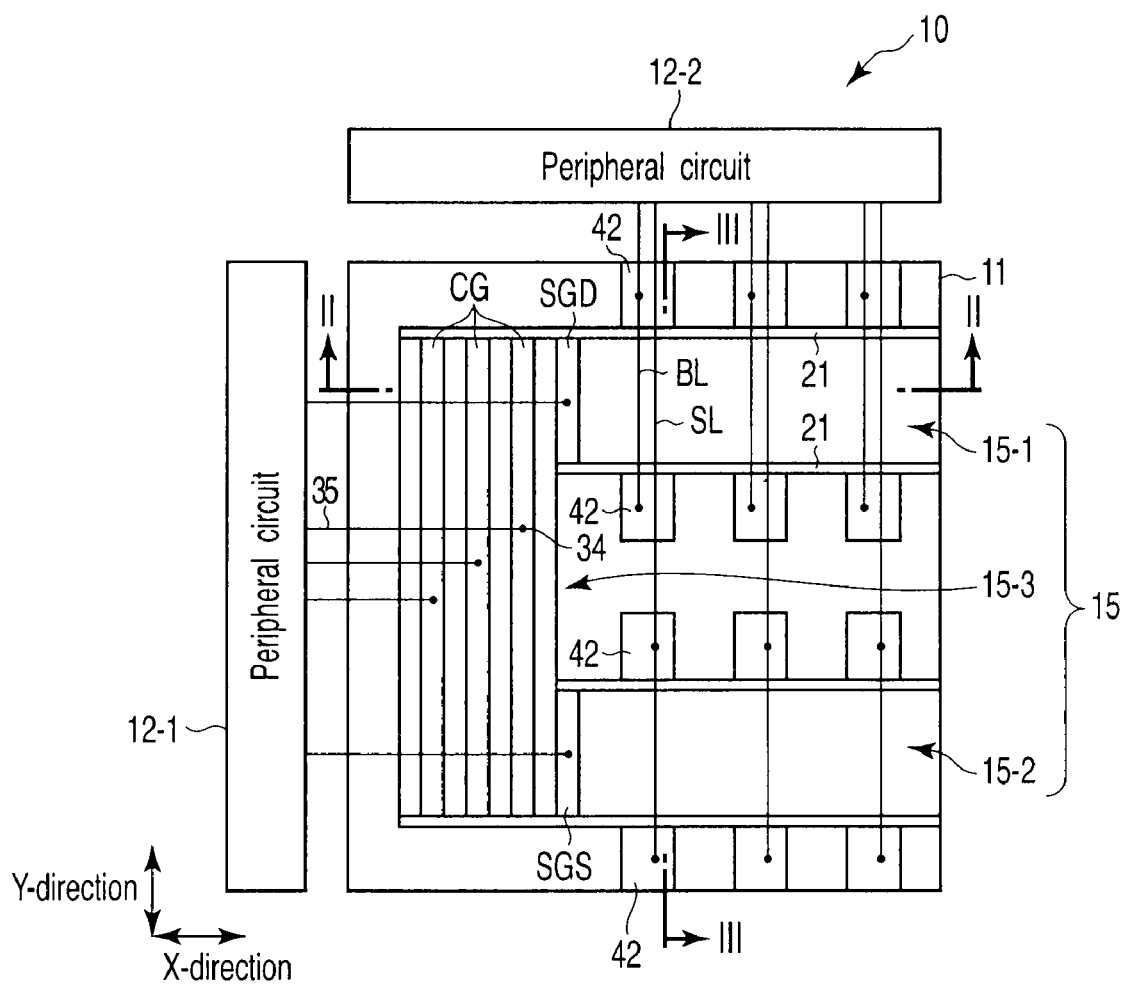
FIG. 30 is a plan view of a NAND flash memory 10 according to the fourth embodiment of the present invention.

FIG. 30 is a plan view of a NAND flash memory 10 according to the fourth embodiment of the present invention. FIG. 31A is a sectional view of the NAND flash memory 10 taken along line III-III in FIG. 30. Note that the section of the NAND flash memory 10 taken along line II-II in FIG. 30 is the same as FIG. 24.

A semiconductor layer 42 serving as the active layer of a memory cell transistor CT and the selection gate transistors ST1 and ST2 has a U-shape. In other words, of semiconductor pillars formed between first and second stacked structures 15-1 and 15-2, the lower portions of two semiconductor pillars adjacent to each other in the Y-direction are connected to form the U-shaped semiconductor layer 42.

In addition, the semiconductor layer 42 comprises a U-shaped N$^-$-type semiconductor layer 42C, two P$^-$-type semiconductor layers 42B and 42D formed on the upper ends of the N⁻-type semiconductor layer 42C, and N⁺-type semiconductor layers 42A and 42E respectively formed on the P⁻-type semiconductor layers 42B and 42D.

The N⁻-type semiconductor layer 42C is formed in that portion of the memory cell transistor CT which opposes a control gate line CG, and functions as the active layer of the memory cell transistor CT. The P⁻-type semiconductor layer 42B is formed in a portion opposing a selection gate line SGD, and functions as the channel region of the selection gate transistor ST1. The P⁻-type semiconductor layer 42D is formed in a portion opposing a selection gate line SGS, and functions as the channel region of the selection gate transistor ST2. The N⁺-type semiconductor layer 42A functions as the drain region of the selection gate transistor ST1. The N⁺-type semiconductor layer 42E functions as the source region of the selection gate transistor ST2.

An N⁺-type diffusion region 41 is formed below the semiconductor layer 42 in a P-type semiconductor substrate 13. The N⁺-type diffusion region 41 is formed to correspond to the semiconductor layer 42. That is, two semiconductor layers 42 adjacent to each other in the X-direction are electrically isolated from each other. In addition, an insulating layer 44 is formed inside the U-shaped semiconductor layer 42.

A bit line BL is formed on the N⁺-type semiconductor layer 42A. A source line SL is formed on the N⁺-type semiconductor layer 42E. A NAND cell unit is thus formed.

As shown in FIG. 31B, the bit line BL may also be separated on the stacked structure between adjacent U-shaped channels. This makes it possible to prevent junction leakage between the N⁺-type diffusion region 41 and P-type semiconductor substrate 13 connected to an unselected memory cell string adjacent to a selected memory cell string as an object of data write or read. That is, when the selection gate line SGD of the selected memory cell string is turned on, the selection gate line SGD of the unselected memory cell string is also turned on. Consequently, a leakage current generated between the N⁺-type diffusion region 41 and P-type semiconductor substrate 13 of the unselected memory cell string flows through the bit line BL, thereby causing read disturbance. Therefore, the bit line BL between the selected memory cell string and unselected memory cell string is separated by separating the bit line BL on the stacked structure between adjacent U-shaped channels. This makes it possible to prevent the leakage current generated in the unselected memory cell from flowing through the bit line BL of the selected memory cell string.

An example of a manufacturing method of the NAND flash memory 10 will be explained below. As in the third embodiment, a U-shaped gate line stacked structure 15 is formed on a P-type semiconductor substrate 13.

Then, as shown in FIG. 32, silicon oxide films 19 and silicon nitride films 20 are formed on the two side surfaces in the Y-direction of a first stacked structure 15-1. Similarly, silicon oxide films 19 and silicon nitride films 20 are formed on the two side surfaces in the Y-direction of a second stacked structure 15-2.

Subsequently, as shown in FIG. 33, the silicon oxide films 19 and silicon nitride films 20 are etched back such that the upper surfaces of the silicon oxide films 19 and silicon nitride films 20 are almost leveled with the upper surfaces of uppermost control gate lines CG.

As shown in FIG. 34, silicon oxide films 21 are formed on the side surfaces of the silicon nitride films 20 and on the side surfaces of selection gate lines SGD and SGS. Consequently, gate insulating films 18 made of ONO films are formed on the side surfaces of the control gate lines CG. On the other hand, single-layered gate insulating films 21 are formed on the side surfaces of the selection gate lines SGD and SGS.

As shown in FIG. 35, a mask layer (not shown) exposing semiconductor layer 42 formation regions is formed on the P-type semiconductor substrate 13, and used as a mask to dope an N⁺-type impurity into the P-type semiconductor substrate 13. As a consequence, N⁺-type diffusion regions 41 equal in number to semiconductor layers 42 are formed in the P-type semiconductor substrate 13. After that, the mask layer is removed.

As shown in FIG. 36, an N⁻-type semiconductor layer 42-1, P⁻-type semiconductor layer 42-2, and N⁺-type semiconductor layer 42-3 are sequentially formed on the P-type semiconductor substrate 13 by epitaxial growth so as to fill a portion between the stacked structures 15-1 and 15-2. More specifically, the N⁻-type semiconductor layer 42-1, P⁻-type semiconductor layer 42-2, and N⁺-type semiconductor layer 42-3 are formed by repeating deposition of amorphous silicon and doping of an impurity.

Then, as shown in FIG. 37, a semiconductor layer 42 (including the N⁻-type semiconductor layer 42-1, P⁻-type semiconductor layer 42-2, and N⁺-type semiconductor layer 42-3) is selectively etched and separated into NAND cell units by lithography and RIE. Subsequently, an insulator is buried between adjacent semiconductor layers 42, thereby forming an insulating layer between the semiconductor layers 42 on the P-type semiconductor substrate 13.

As shown in FIG. 38, an opening 43 is formed in each semiconductor layer 42 by using lithography and RIE, thereby forming a U-shaped semiconductor layer 42. Then, as shown in FIG. 39, an insulator is buried in the opening 43 to form an insulating layer 44 inside the U-shaped semiconductor layer 42. After that, interconnections connected to gate line layers 17 and the semiconductor layers 42 are formed. In this manner, the NAND flash memory 10 shown in FIGS. 30 and 31A is formed.

In this embodiment as has been described in detail above, a NAND cell unit in which the selection gate transistors ST1 and ST2 are connected to the two ends of a memory cell string can be formed. In addition, it is possible to reduce the numbers of contacts and interconnections to be used to connect the gate line stacked structures to a peripheral circuit.

Figure 40:
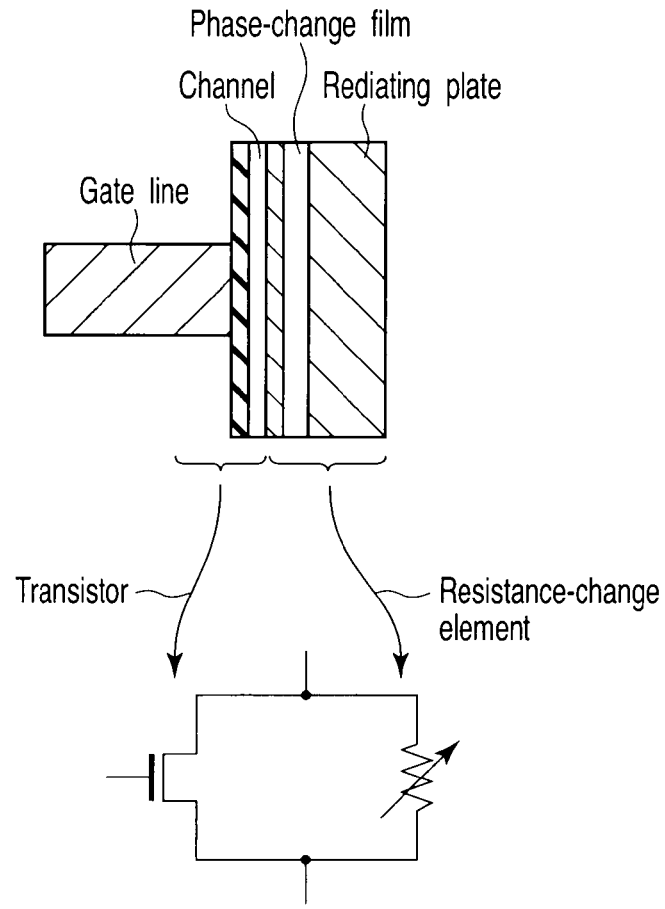
FIG. 40 is a view showing a memory element of a PRAM.
Figure 41:
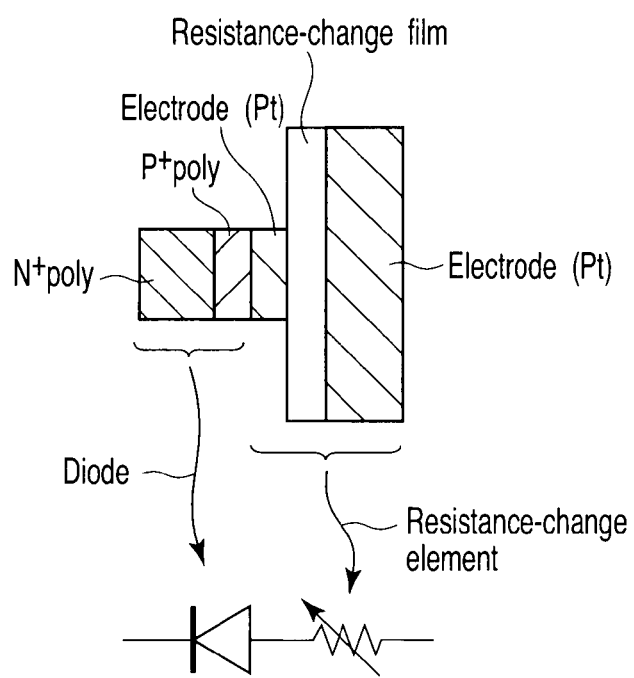
FIG. 41 is a view showing a memory element of a ReRAM.

Note that it is of course also possible to use the gate line stacked structure 15 disclosed in each embodiment in a memory other than a NAND flash memory. More specifically, the memory cell transistor CT shown in FIG. 4 may be replaced with a phase-change RAM (PRAM) as shown in FIG. 40, or a resistance-change RAM (ReRAM) as shown in FIG. 41. The gate line stacked structure 15 may also be used in a logic element having a stacked structure that is not a memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a substrate having a step including a first upper surface and a second upper surface higher than the first upper surface;
   a memory cell array formed on the first upper surface, wherein the memory cell array includes a stacked structure having a plurality of first interconnection layers and a plurality of second interconnection layers respectively connected to the first interconnection layers, the first interconnection layers are stacked on the first upper surface, are separated from each other by insulating films, and extend in a first direction, and the second interconnection layers extend upward and are separated from each other by insulating films;

a peripheral circuit formed on the second upper surface and configured to supply an electrical signal to the memory cell array; and a plurality of contacts respectively formed on upper ends of the second interconnection layers, wherein the first interconnection layers and the second interconnection layers comprise continuous layers, respectively, the upper ends of the second interconnection layers are leveled with the second upper surface, and the contacts are laid out obliquely to the first direction.

2. The device according to claim 1, wherein the first interconnection layers and the second interconnection layers are made of identical layers.

3. The device according to claim 2, wherein a width of the second interconnection layer is the same as that of the first interconnection layer.

4. The device according to claim 1, wherein an upper surface of the stacked structure is leveled with the second upper surface.

5. The device according to claim 1, wherein the contacts are laid out zigzag.

6. The device according to claim 1, wherein the second interconnection layers extend obliquely such that a length in the first direction of the stacked structure increases upward.

7. The device according to claim 1, which further comprises:

a first insulating film formed on a side surface of the stacked structure such that the first insulating film is in contact with the first interconnection layers;

a charge storage layer formed on a side surface of the first insulating film;

a second insulating film formed on a side surface of the charge storage layer; and an active layer formed on a side surface of the second insulating film, and in which the first interconnection layers comprise control gate electrodes.

8. The device according to claim 1, which further comprises:

a first insulating film formed on one side surface of the stacked structure which extends in the first direction, such that the first insulating film is in contact with the first interconnection layers;

a first charge storage layer formed on a side surface of the first insulating film;

a second insulating film formed on a side surface of the first charge storage layer;

a first active layer formed on a side surface of the second insulating film;

a third insulating film formed on the other side surface of the stacked structure which extends in the first direction, such that the third insulating film is in contact with the first interconnection layers;

a second charge storage layer formed on a side surface of the third insulating film;

a fourth insulating film formed on a side surface of the second charge storage layer; and a second active layer formed on a side surface of the fourth insulating film, and in which the first interconnection layers comprise control gate electrodes.

9. A semiconductor memory device comprising:

a substrate having a step including a first upper surface and a second upper surface higher than the first upper surface;

a memory cell array formed on the first upper surface, wherein the memory cell array includes:

a first stacked structure having a plurality of first interconnection layers stacked on the first upper surface, separated from each other by insulating films, and extending in a first direction;

a second stacked structure adjacent to the first stacked structure in a second direction perpendicular to the first direction, and having a plurality of second interconnection layers stacked on the first upper surface, separated from each other by insulating films, and extending in the first direction; and a plurality of third interconnection layers connecting the first interconnection layers and the second interconnection layers, respectively, extending upward, and separated from each other by insulating films;

a peripheral circuit formed on the second upper surface and configured to supply an electrical signal to the memory cell array; and a plurality of contacts respectively formed on upper ends of the third interconnection layers, wherein the first interconnection layers, the second interconnection layers and the third interconnection layers comprise continuous layers, respectively, the upper ends of the third interconnection layers are leveled with the second upper surface; and the contacts are laid out obliquely to the first direction.

10. The device according to claim 9, wherein the first interconnection layers, the second interconnection layers and the third interconnection layers are made of identical layers.

11. The device according to claim 10, wherein a length in the second direction of the third interconnection layer is the same as a length from an end of the first stacked structure to an end of the second stacked structure in the second direction.

12. The device according to claim 9, wherein an upper end of the third interconnection layer is leveled with the second upper surface.

13. The device according to claim 9, wherein the contacts are laid out zigzag.

14. The device according to claim 9, wherein the third interconnection layers extend obliquely to separate upward from the first stacked structure.

15. The device according to claim 9, which further comprises:

a first insulating film formed on a side surface of the first stacked structure, such that the first insulating film is in contact with the first interconnection layers;

a first charge storage layer formed on a side surface of the first insulating film;

a second insulating film formed on a side surface of the first charge storage layer;

a first active layer formed on a side surface of the second insulating film;

a third insulating film formed on a side surface of the second stacked structure, such that the third insulating film is in contact with the second interconnection layers;

a second charge storage layer formed on a side surface of the third insulating film;

a fourth insulating film formed on a side surface of the second charge storage layer; and a second active layer formed on a side surface of the fourth insulating film, and in which the first interconnection layers and the second interconnection layers comprise control gate electrodes.

16. The device according to claim 9, which further comprises:

a first insulating film formed on a side surface of the first stacked structure which opposes the second stacked structure, such that the first insulating film is in contact with the first interconnection layers;

a first charge storage layer formed on a side surface of the first insulating film;

a second insulating film formed on a side surface of the first charge storage layer;

a third insulating film formed on a side surface of the second stacked structure which opposes the first stacked structure, such that the third insulating film is in contact with the second interconnection layers;

a second charge storage layer formed on a side surface of the third insulating film;

a fourth insulating film formed on a side surface of the second charge storage layer; and an active layer having a U-shape and formed on side surfaces of the second insulating film and the fourth insulating film, and in which the first interconnection layers and the second interconnection layers comprise control gate electrodes.

* * * * *